(12) United States Patent
Hoshi et al.

(10) Patent No.: US 8,259,390 B2
(45) Date of Patent: Sep. 4, 2012

(54) OPTICAL AMPLIFIER APPARATUS

(75) Inventors: Ryuta Hoshi, Fukuoka (JP); Toshihiro Ohtani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 498 days.

(21) Appl. No.: 12/409,054

(22) Filed: Mar. 23, 2009

(65) Prior Publication Data

US 2009/0237781 A1    Sep. 24, 2009

(30) Foreign Application Priority Data

Mar. 24, 2008   (JP) .................................. 2008-074954

(51) Int. Cl.
*H01S 5/00*    (2006.01)
*H04B 10/12*    (2006.01)

(52) U.S. Cl. .................. 359/344; 359/341.1; 359/341.43

(58) Field of Classification Search ............... 359/341.1, 359/341.43, 344
See application file for complete search history.

(56) References Cited

U.S. PATENT DOCUMENTS

| | | | | |
|---|---|---|---|---|
| 4,979,234 A * | 12/1990 | Agrawal et al. | ............... | 398/199 |
| 5,280,383 A * | 1/1994 | Federici et al. | .......... | 359/341.33 |
| 5,861,970 A * | 1/1999 | Tatham et al. | ................ | 398/150 |
| 6,487,008 B2 * | 11/2002 | Morito | ........................... | 359/344 |
| 6,515,796 B2 * | 2/2003 | Jackel | ........................... | 359/344 |
| 6,621,620 B2 * | 9/2003 | Ohtani | ........................... | 359/334 |
| 6,778,320 B1 * | 8/2004 | Traynor | ........................ | 359/334 |
| 7,034,996 B2 | 4/2006 | Yamanaka | | |
| 2004/0062557 A1 * | 4/2004 | Takashima et al. | ............ | 398/209 |
| 2006/0291037 A1 * | 12/2006 | Iannone et al. | ................ | 359/334 |
| 2007/0285765 A1 * | 12/2007 | Yeh et al. | ........................ | 359/344 |

FOREIGN PATENT DOCUMENTS

JP    2005-192077    7/2005

OTHER PUBLICATIONS

Cho et al., "Dynamically gain-flattened hybrid optical amplifier utilizing erbium doped fiber amplifier and semiconductor optical amplifier", Optical Communication, 1998, 24th European Conference on Optical Communication, pp. 363-364, Sep. 24, 1998.*

* cited by examiner

*Primary Examiner* — Eric Bolda
(74) *Attorney, Agent, or Firm* — Staas & Halsey LLP

(57) ABSTRACT

An optical amplifier apparatus includes an optical amplifier including an amplification medium doped with an active substance, the amplification medium excited in order to amplify light; a semiconductor optical amplifier arranged after the optical amplifier; a driver for supplying a driving current with respect to the semiconductor optical amplifier in order that the semiconductor optical amplifier has an amplification characteristic with respect to an input light, the amplification characteristic including a gain non-saturated region and a gain saturated region; and an input-light level adjuster for adjusting an out put light of the optical amplifier to the input light level of the semiconductor optical amplifier, the input light level being set up between the gain non-saturated region and the gain saturated region.

4 Claims, 21 Drawing Sheets

OPTICAL AMPLIFIER APPARATUS

CROSS-REFERENCE TO RELATED APPLICATIONS

This application is based upon and claims the benefit of priority of the prior Japanese Patent Application No. 2008-074954, filed on Mar. 24, 2008, the entire contents of which are incorporated herein by reference.

FIELD

The embodiments discussed herein are related to an optical amplifiers.

BACKGROUND

In recent years, progress has been made in architecting optical network communications using WDM (Wavelength Division Multiplexing) techniques for multiplexing together and transmitting a plurality of light signals having different wavelengths. EDFAs (Erbium-Doped Fiber Amplifiers) are broadly employed in the optical amplifiers for use in VDW systems.

An EDFA, an optical amplifier using an erbium ($Er^{3+}$)-doped fiber (EDF) as an amplification medium, allows an optical signal to travel by illuminating the excitation light outputted from an excitation light source (semiconductor laser) to the optical fiber, and amplifies the level of the light signal by means of stimulated emission occurring at that time.

As a conventional optical transmission technique, a proposal has been made on a technique that, if a change in level of a light signal to be inputted to the optical amplifier is detected, an optical-surge occurrence alarm signal is outputted to reduce the gain of the optical amplifier. See for example Japanese Laid-open Patent Publication No. 2005-192077 paragraphs [0010] to [0013], FIG. 1.

The EDFA is able to amplify collectively and send a WDM signal in which a plurality of wavelengths are multiplexed together, by inputting excitation optical power commensurate with the number of wavelengths multiplexed. However, where adjustment control of excitation optical power cannot swiftly cope with the change in level of the light input to the EDFA (change in the number of wavelengths multiplexed in a WDM signal to be inputted, interruption of input light, or the like), a remaining portion of light, called an optical surge, arises, which has been responsible for the occurrence of transmission errors.

FIG. 21 is a figure showing an optical surge. It illustrates one example of optical surge occurrence. For example, it is assumed that 40 waves of a WDM signal are inputted to an EDFA and the number of wavelengths in the input WDM signal changes into one during transmission of those waves by providing excitation optical power for amplifying the 40 waves of one WDM signal.

If the light input to the EDFA changes in level due to such a change in the number of wavelengths multiplexed and control of switching from excitation optical power corresponding to 40 waves to that corresponding to one wave is slow, the EDFA requires that the time for which excitation light is inputted for 40 waves is increased relative to that of input for one wave. If this is the case, the gain abruptly changes with the result that a high-level optical surge, for example 1 ms or greater, instantaneously emerges from the EDFA.

There has been a problem that an optical surge, if transmitted, raises transmission errors or, in the case where EDFAs are connected in multiple stages, the receiver is broken by the amplification of cumulated optical surges.

Meanwhile, in the prior art of Japanese Laid-open Patent Publication No. 2005-192077, optical surge suppression is performed by reducing the gain of an optical amplifier under circuit control after detecting a change in level of the input light. However, because optical input power changes in level instantaneously, there is a difficulty in following changes in level under such control. In the gain adjustment under circuit control after a change in level of input light as in the prior art, an instantaneously occurred optical surge possibly propagates downstream, making it difficult to fully suppress an optical surge.

SUMMARY

According to an aspect of the invention, an optical amplifier apparatus includes an optical amplifier including an amplification medium doped with an active substance, the amplification medium excited in order to amplify light; a semiconductor optical amplifier arranged after the optical amplifier; a driver for supplying a driving current with respect to the semiconductor optical amplifier in order that the semiconductor optical amplifier has an amplification characteristic with respect to an input light, the amplification characteristic including a gain non-saturated region and a gain saturated region; and an input-light level adjuster for adjusting an out put light of the optical amplifier to the input light level of the semiconductor optical amplifier, the input light level being set up between the gain non-saturated region and the gain saturated region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
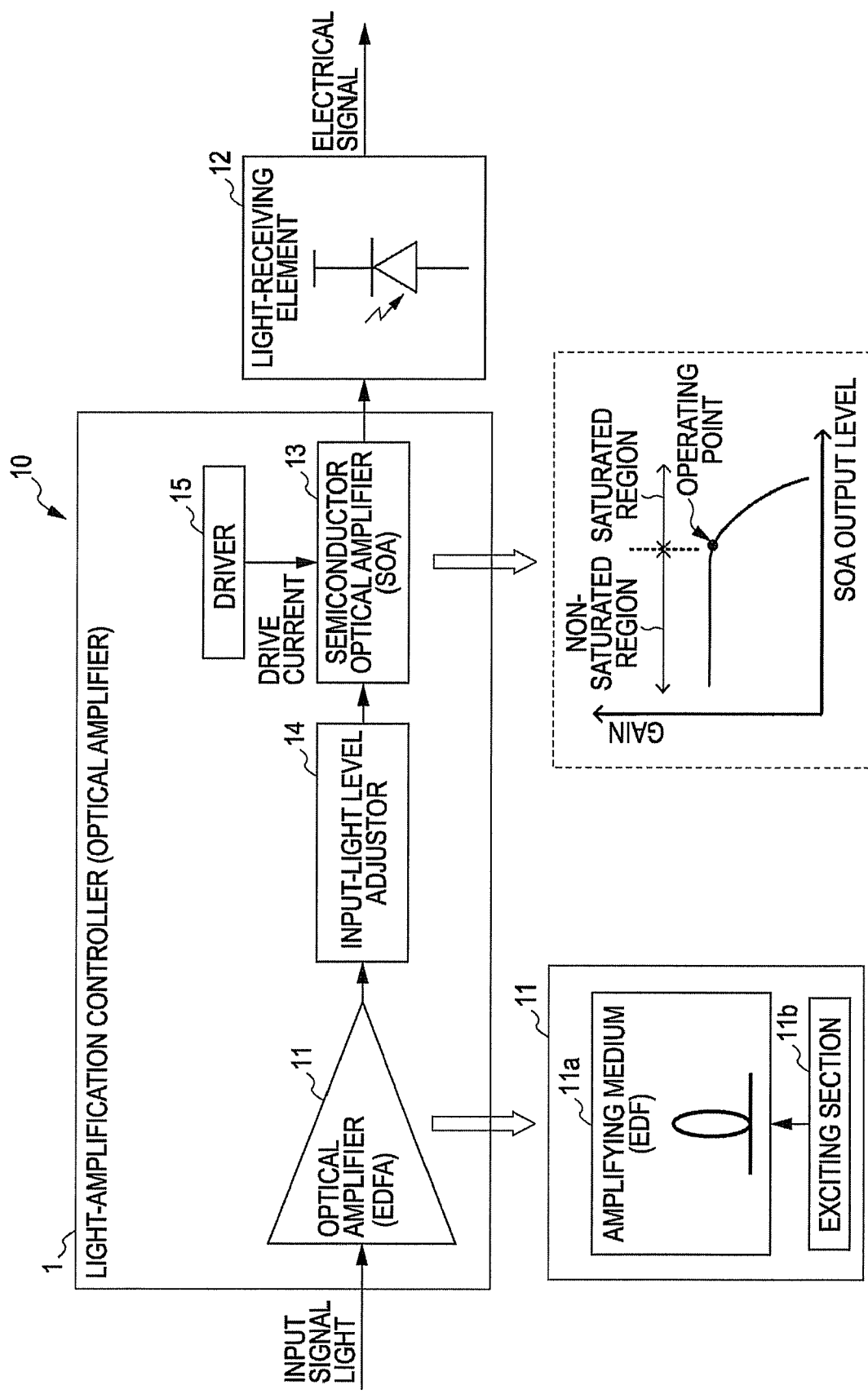
FIG. 1 is a principle diagram of a light receiving apparatus.

In the following, an embodiment of the present invention will be explained with reference to the drawings. FIG. 1 is a principle diagram of a light receiving apparatus. A light receiving apparatus 10 is configured with a light-amplification controller 1 (corresponding to an optical amplifier) and a light-receiving element 12. The light-amplification controller 1 is a device that is configured with an optical amplification section 11, a semiconductor optical amplifier 13, an input-light level adjustor 14 and a driver 15 and is for performing reception control of a light signal.

The optical amplification section 11 is constituted by an amplification medium 11a doped with an active substance for optical amplification and an exciting section 11b, to amplify the input signal light by exciting the amplification medium 11a by means of the excitation light emitted from the exciting section 11b. Incidentally, the amplification medium 11a may be an EDF doped with erbium. Hereinafter, the optical amplification section 11 is referred to as an EDFA 11.

The light-receiving element 12 is an element that receives the signal light amplified at and outputted from the EDFA 11 and converts it into an electrical signal, and may be a PIN-PD (P intrinsic N-Photo Diode) or an APD (Avalanche Photo Diode), for example.

The semiconductor optical amplifier 13 is arranged between the EDFA 11 and the light-receiving element 12 in order to suppress the optical surge occurring when an abrupt change is imparted to the level of light input to the EDFA 11.

Note that the semiconductor optical amplifier 13 is specifically an SOA (Semiconductor Optical Amplifier). The SOA is an optical switch element that possesses both a function of acting as an optical gate for turning on and off light and a function of amplification, by changing the gain on the basis of the drive current injected into a semiconductor amplifier (when the gate is on, light is amplified and outputted). The SOA usually is frequently used in a gate switch for optical packet switching. However, in the light receiving apparatus 10, it is arranged after the EDFA 11 and used mainly to suppress an optical surge (naturally, it may also be used as a gate switch providing the function of suppressing optical surges). Hereinafter, the semiconductor optical amplifier 13 is referred to as an SOA 13.

The input-light level adjustor 14 controls the level of the signal light outputted from the EDFA 11 and adjusts the level of light input to the SOA 13. The driver 15 supplies a drive current for adjusting the level of output light of the SOA 13, to the SOA 13.

Here, the light-receiving element 12 has an allowable maximum level of input light that differs according to the type thereof (a PIN-PD, an APD or the like). Accordingly, the driver 15 supplies such an amount of drive current that the maximum level of output light of the SOA 13 does not exceed the maximum level of input light for the type of the light-receiving element 12 installed.

Meanwhile, the input-light level adjustor 14 sets up a light level of the signal light to be inputted to the SOA 13 such that the operating point of the SOA lies close to a boundary between a non-saturated region (gain non-saturated region) and a saturated region (gain saturated region), with respect to the amplification characteristic of the SOA 13 in which amplification is performed on the basis of the amount of drive current supplied.

The SOA 13 suppresses an optical surge (details of optical surge suppression is discussed later) by operating at its set up operating point because the output of the SOA 13 does not rise to a constant level or higher due to a gain saturation even when an optical surge arises at the EDFA 11 and the optical surge is inputted.

Figure 2:
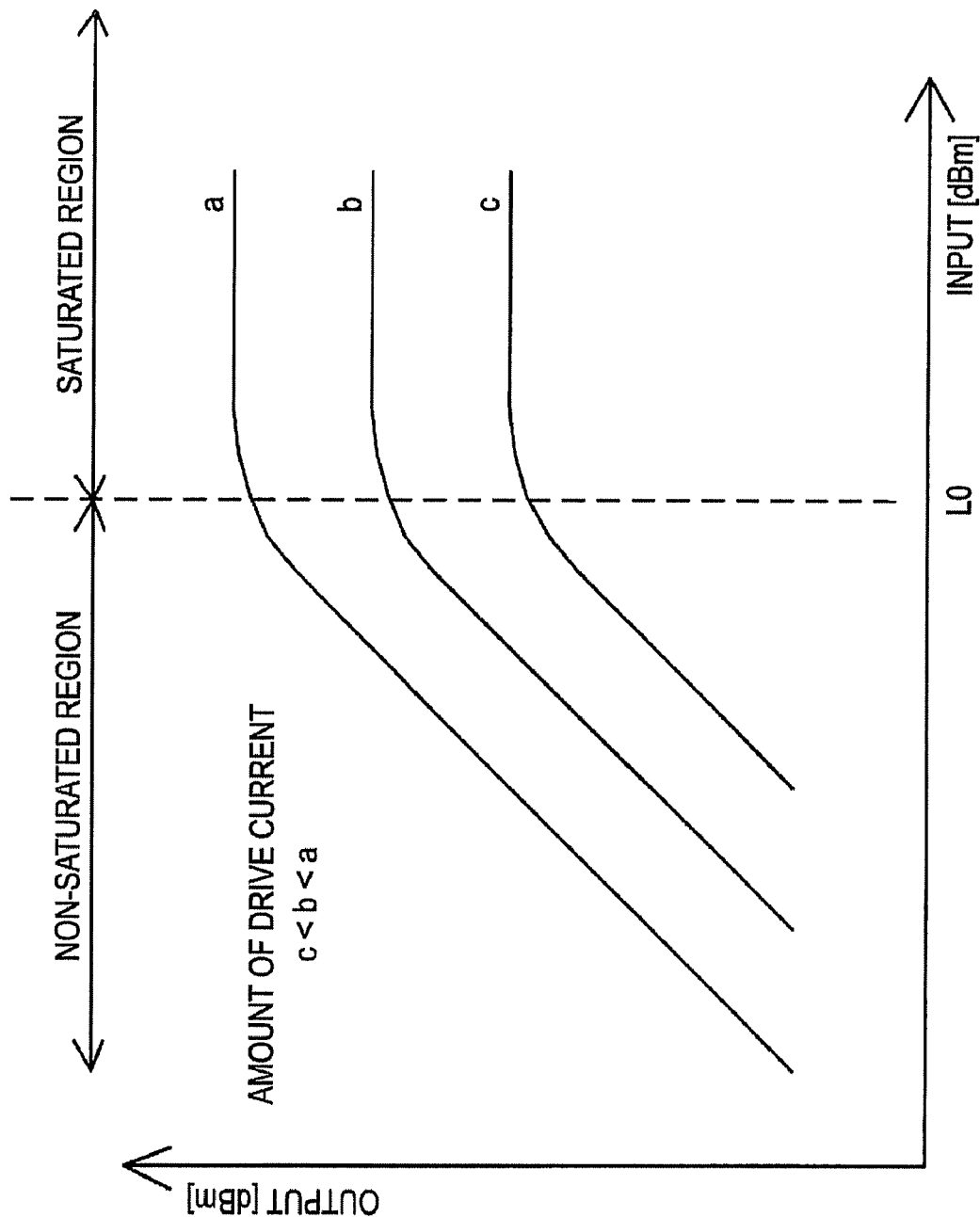
FIG. 2 is a figure showing the level of output light of an SOA.

Next, the amplification characteristic of the SOA 13 is explained. FIG. 2 is a figure showing the level of output light of the SOA 13. The vertical axis denotes an output-light level dBm while the horizontal axis denotes an input-light level dBm. It shows an output-light level against an input-light level, which is dependent upon the drive current injected into the SOA 13.

The level of output light of the SOA 13 changes with the injected drive current, wherein the greater the amount of drive current the greater the level of output light for an equal level of input light. Meanwhile, there is a region where, up to a certain level of input light (assumed as an input-light level L0), the level of output light linearly increases with the increase in level of input light and a region where, beyond the input-light level L0, the level of output light ceases from increasing. The former is referred to as a non-saturated region while the latter is referred to as a saturated region.

Figure 3:
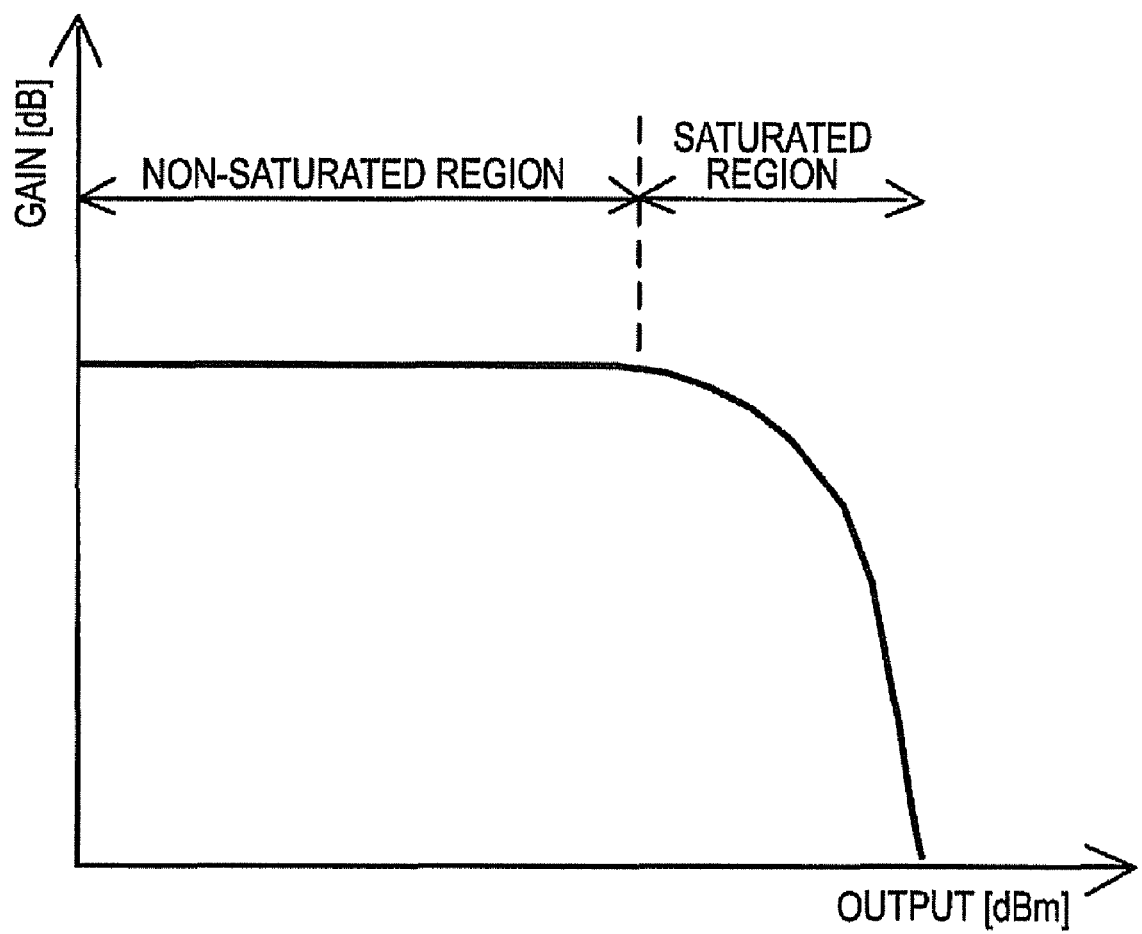
FIG. 3 is a figure showing the gain of the SOA.

FIG. 3 is a figure showing the gain of the SOA 13. The vertical axis denotes a gain dB while the horizontal axis denotes an output-light level dBm. As can be seen from the figure, in the saturated region, the amplification gain rapidly decreases as the level of output light increases.

In this manner, the amplification characteristic of the SOA 13 has a feature that, in the non-saturated region, the gain is constant for the case of a constant injection drive current and the level of output light increases as the level of input light increases whereas, in the saturated region, the level of output light does not increase beyond a certain level because the gain decreases with an increase in level of input light.

Next, the operation control of the SOA 13 for suppressing against optical surges is explained. First of all, the amount of drive current for driving the SOA 13 is determined such that the driver 15 supplies such an amount of drive current that the maximum level of output light of the SOA 13 does not exceed the maximum level of input light for the type of the light-receiving element 12 arranged after the SOA 13 because the SOA 13 is able to adjust the level of output light by adjusting the amount of drive current to be injected. Due to this, the light-receiving element 12 is protected.

After determining the amount of drive current, the level of light input to the SOA 13 is determined. The input-light level adjustor 14 adjusts the level of the signal light outputted from the EDFA 11 such that the input-light level of the signal light to be inputted to the SOA 13 lies close to the input-light level L0 shown in FIG. 2. Namely, the level of input light is set up in a manner that the operating point (driving point) of the SOA 13 comes close to the boundary between the non-saturated region and the saturated region (detailed setting of the level of input light will be described later with reference to FIG. 20).

Figure 4:
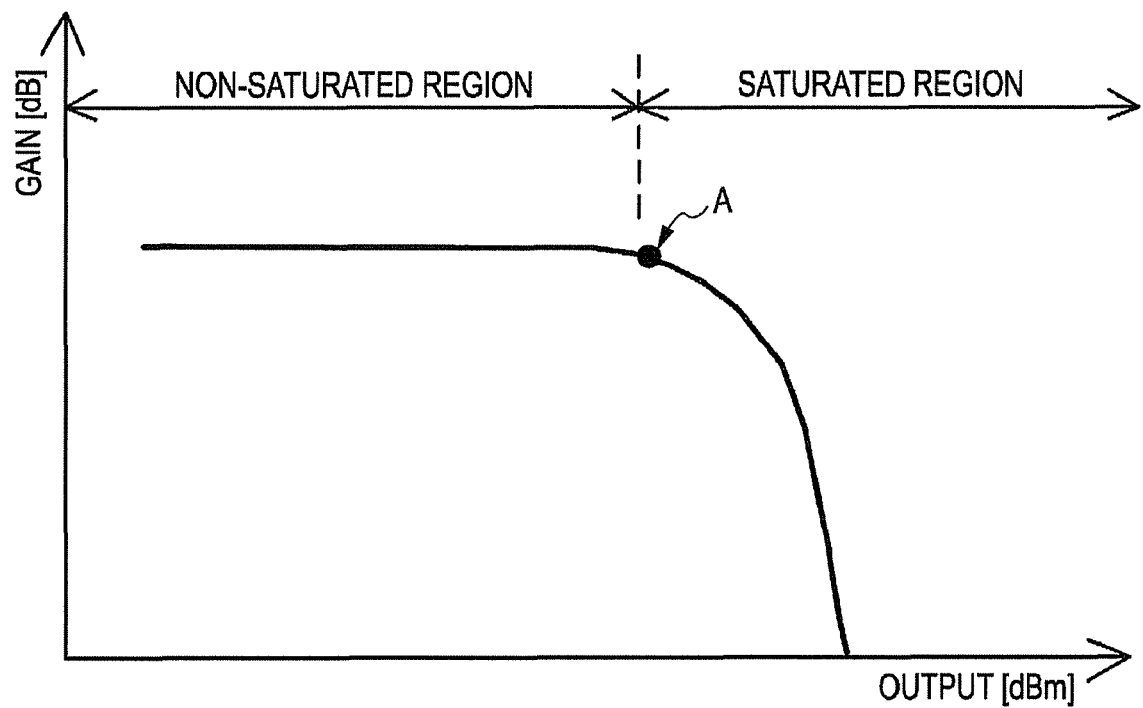
FIG. 4 is a figure showing the operating point of the SOA.

FIG. 4 is a figure showing the operating point of the SOA 13. The vertical axis denotes a gain dB while the horizontal axis denotes an output-light level dBm. In the case where the level of light input to the SOA 13 is set up close to L0, the operating point as seen in terms of gain characteristics is given as a point A lying close to a boundary between a non-saturated region and a saturated region.

Here, because the operating point of the SOA 13 is set up close to border of the non-saturated region and saturated region, the gain of the SOA 13 decreases instead of increasing even if an instantaneous, high-level optical surge is inputted to the SOA 13, so that an optical surge can be suppressed without suddenly outputting high-level signal light from the SOA 13.

Figure 5:
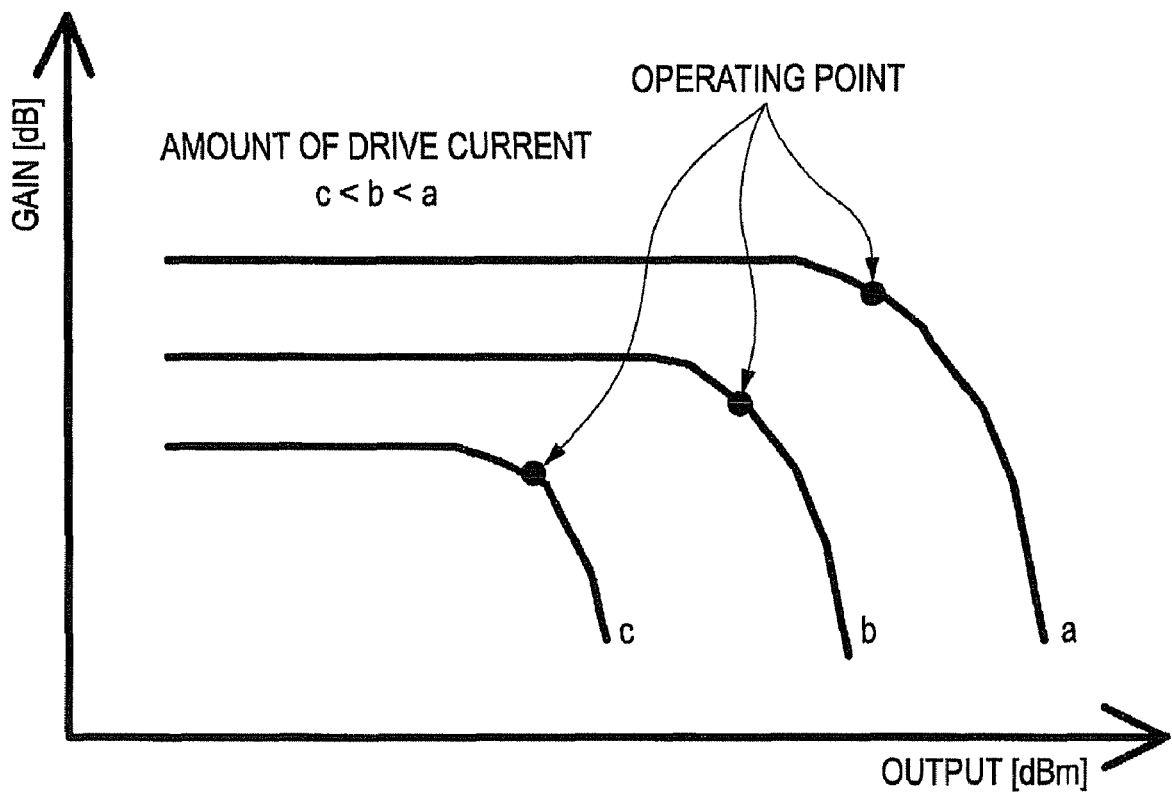
FIG. 5 is a figure showing the operating points for the respective amounts of drive currents in terms of gain characteristics.

Namely, owing to setting of the operating point of the SOA 13 at point A, even if instantaneous change occurs in the level of light input to the EDFA 11 and a high-level optical surge arises so that the optical surge is inputted to the SOA 13 arranged after the EDFA 11, the optical surge can be suppressed because the output of the SOA 13 does not rise to a certain level or higher due to gain saturation. Incidentally, the operating points for respective amounts of drive currents in terms of gain characteristics are shown in FIG. 5.

In this manner, the configuration of the light receiving apparatus 10, because of noticing the physical phenomenon of an element of the SOA 13 and carrying out optical-surge suppression control utilizing amplification characteristics, is able to positively follow an instantaneous change in level, as compared with a conventional method that suppresses an optical surge by reducing the gain of the EDFA under circuit control (switch control from AGC to ALC, or the like) after detecting a level fluctuation. This enables optical surge suppression with far greater effectiveness than the conventional suppression control.

Figure 6:
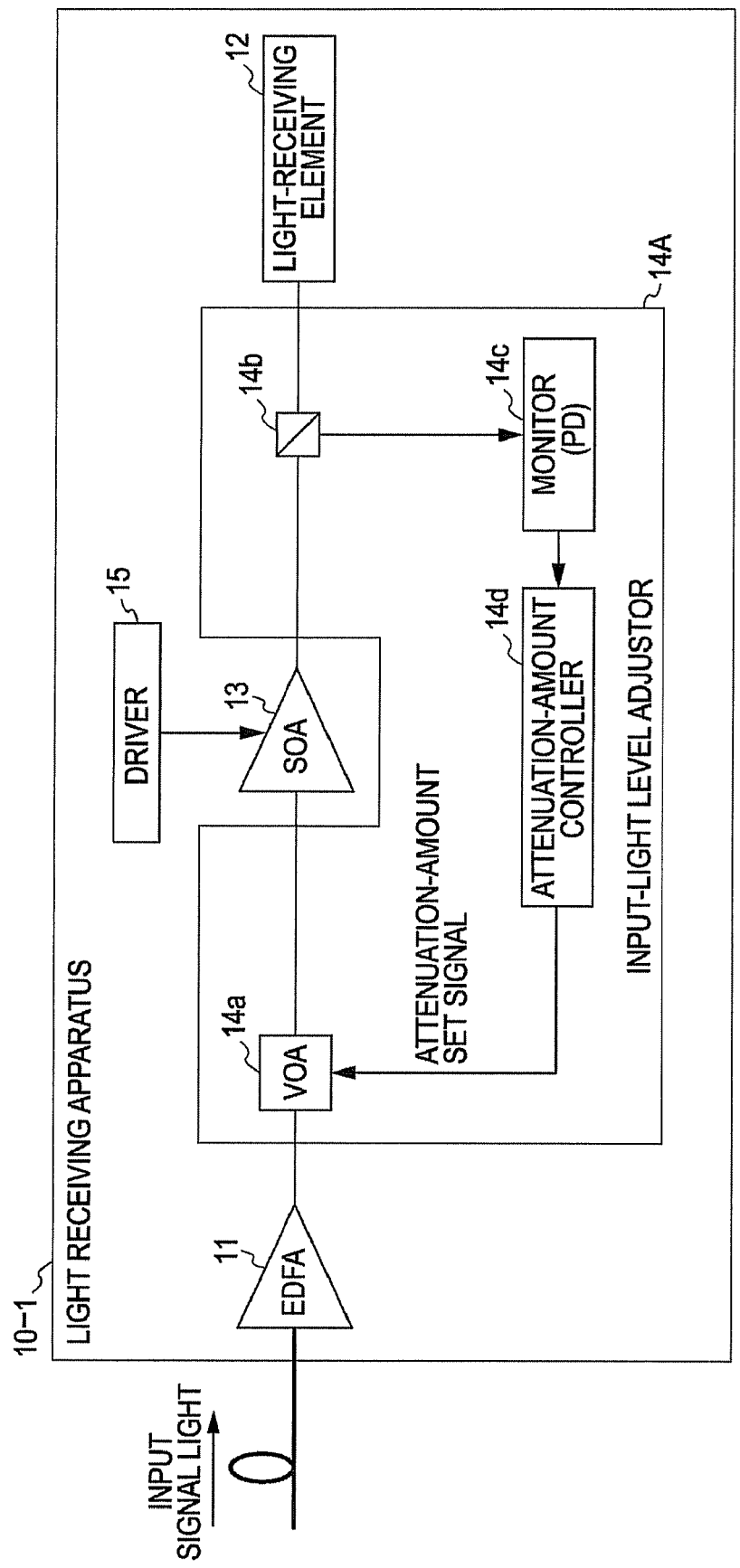
FIG. 6 is a diagram showing a configuration of a light receiving apparatus.

Next, a configuration for the case in which one wave of a light signal (or WDM light having a smaller number of wavelengths, e.g. some several waves) is received is explained with reference to FIG. 6 and FIG. 7, as a configuration of the light receiving apparatus 10.

A light receiving apparatus 10-1 is configured with an EDFA 11, a light-receiving element 12, an SOA 13, an input-light level adjustor 14A and a driver 15. Meanwhile, the input-light level adjustor 14A is configured with a VOA (Variable Optical Attenuator) 14a, a coupler 14b, a monitor 14c and an attenuation-amount control section 14d.

The EDFA 11 amplifies the input signal light and outputs the amplified signal light. The signal light outputted from the EDFA 11 is inputted to the VOA 14a. The VOA 14a adjusts the level of the received signal light on the basis of the attenuation-amount set signal from the attenuation-amount control section 14d.

The SOA 13 is driven by the drive current supplied from the driver 15, and amplifies and outputs the signal light that has been level-adjusted at the VOA 14a. The coupler 14b is arranged between the SOA 13 and the light-receiving element 12, and branches the signal light outputted from the SOA 13 into two parts and outputs one to the light-receiving element 12 and the other to the monitor 14c. The light-receiving element 12 converts the received signal light into an electrical signal and sends it to a processing section existing thereafter.

The monitor 14c is constituted by a PD or the like, and converts the output light of the SOA 13 branched by the coupler 14b into an electrical signal and sends it to the attenuation-amount control section 14d. The attenuation-amount control section 14d recognizes the present level fluctuation of output light of the SOA 13 on the basis of the level of the electrical signal, and generates and sends to the VOA 14a an attenuation-amount set signal for controlling the VOA 14a such that the level of light input to the SOA 13 becomes a predetermined level of input light.

In this manner, the operating point of the SOA 13 is made constant by monitoring the level of output light of the SOA 13, adjusting the VOA 14a and performing control such that the level of light input to the SOA 13 becomes constant.

Figure 7:
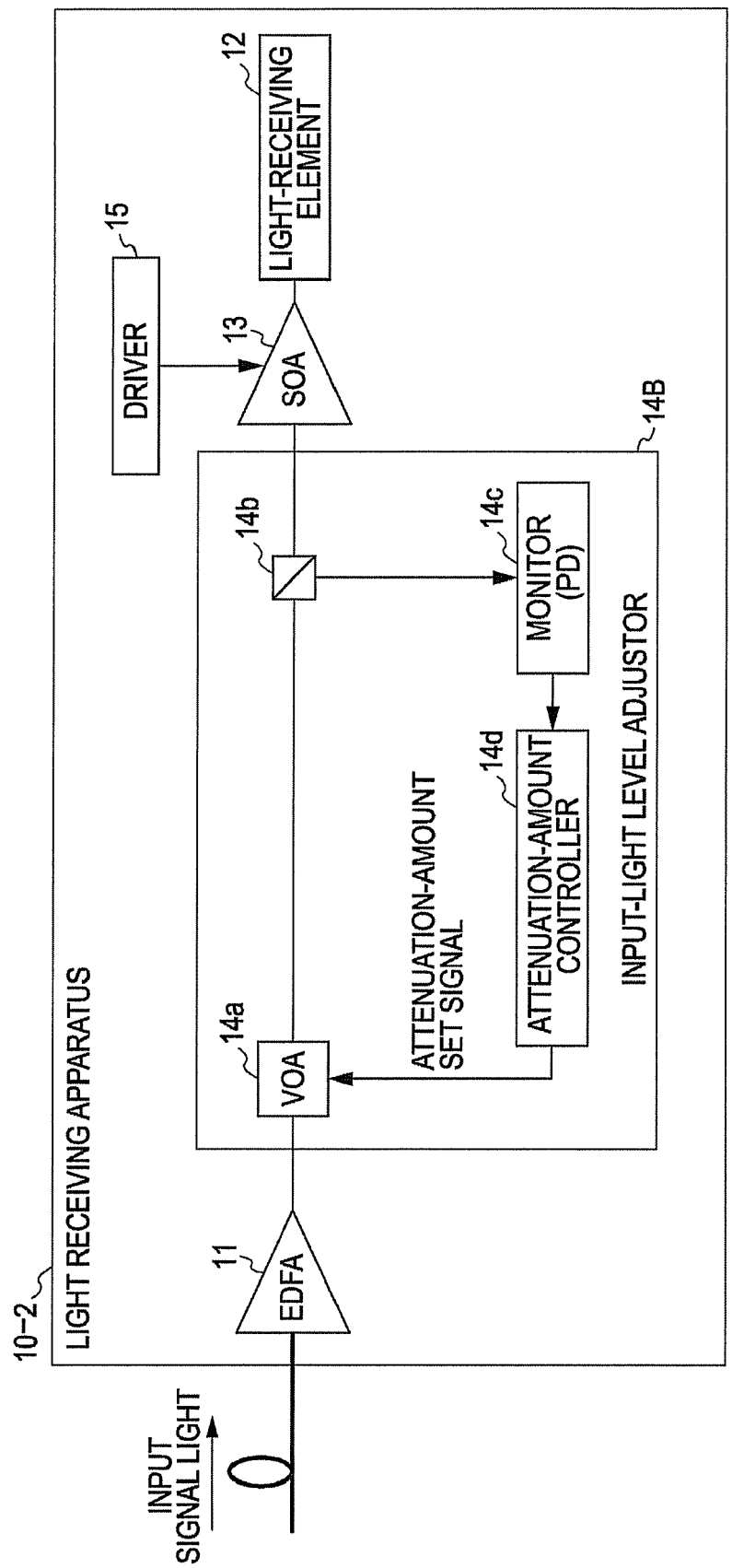
FIG. 7 is a diagram showing a configuration of a light receiving apparatus.

FIG. 7 is a diagram showing a configuration of a light receiving apparatus. A light receiving apparatus 10-2 is configured with an EDFA 11, a light-receiving element 12, an SOA 13, an input-light level adjustor 14B and a driver 15. The input-light level adjustor 14B is configured with a VOA 14a, a coupler 14b, a monitor 14c and an attenuation-amount control section 14d.

The EDFA 11 amplifies the input signal light and outputs amplified signal light. The signal light outputted from the EDFA 11 is inputted to the VOA 14a. The VOA 14a adjusts the level of the received signal light on the basis of the attenuation-amount set signal from the attenuation-amount control section 14d.

The coupler 14b is arranged between the VOA 14a and the SOA 13, and branches the signal light outputted from the VOA 14a into two parts and outputs one to the SOA 13 and the other to the monitor 14c. The SOA 13 is driven by the drive current supplied from the driver 15, and receives and amplification-outputs the signal light that has been branched at the coupler 14b after being adjusted in level at the VOA 14A. The light-receiving element 12 converts the signal light outputted from the SOA 13 into an electrical signal and sends it to a processing section existing thereafter.

The monitor 14c converts the output light of the VOA 14a branched by the coupler 14b into an electrical signal and sends it to the attenuation-amount control section 14d. The attenuation-amount control section 14d recognizes the present amount of input-light change in level to the SOA 13 on the basis of the level of the electrical signal, and generates and sends to the VOA 14a an attenuation-amount set signal for controlling the VOA 14a such that the level of light input to the SOA 13 becomes a predetermined level of input light.

In this manner, the operating point of the SOA 13 is made constant by monitoring the level of light input to the SOA 13, adjusting the VOA 14a and performing control such that the level of light input to the SOA 13 becomes constant.

Figure 8:
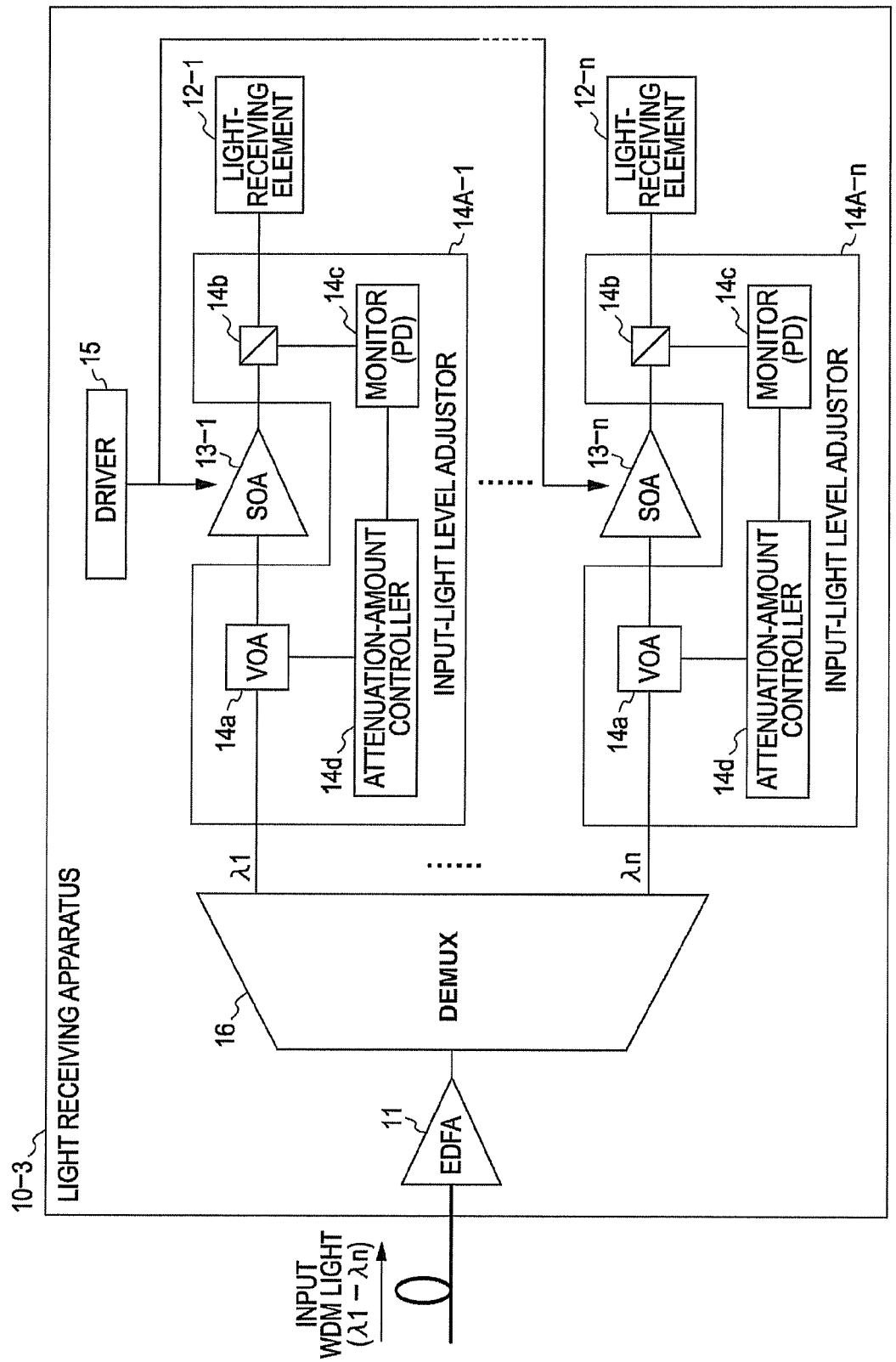
FIG. 8 is a diagram showing a configuration of a light receiving apparatus.
Figure 9:
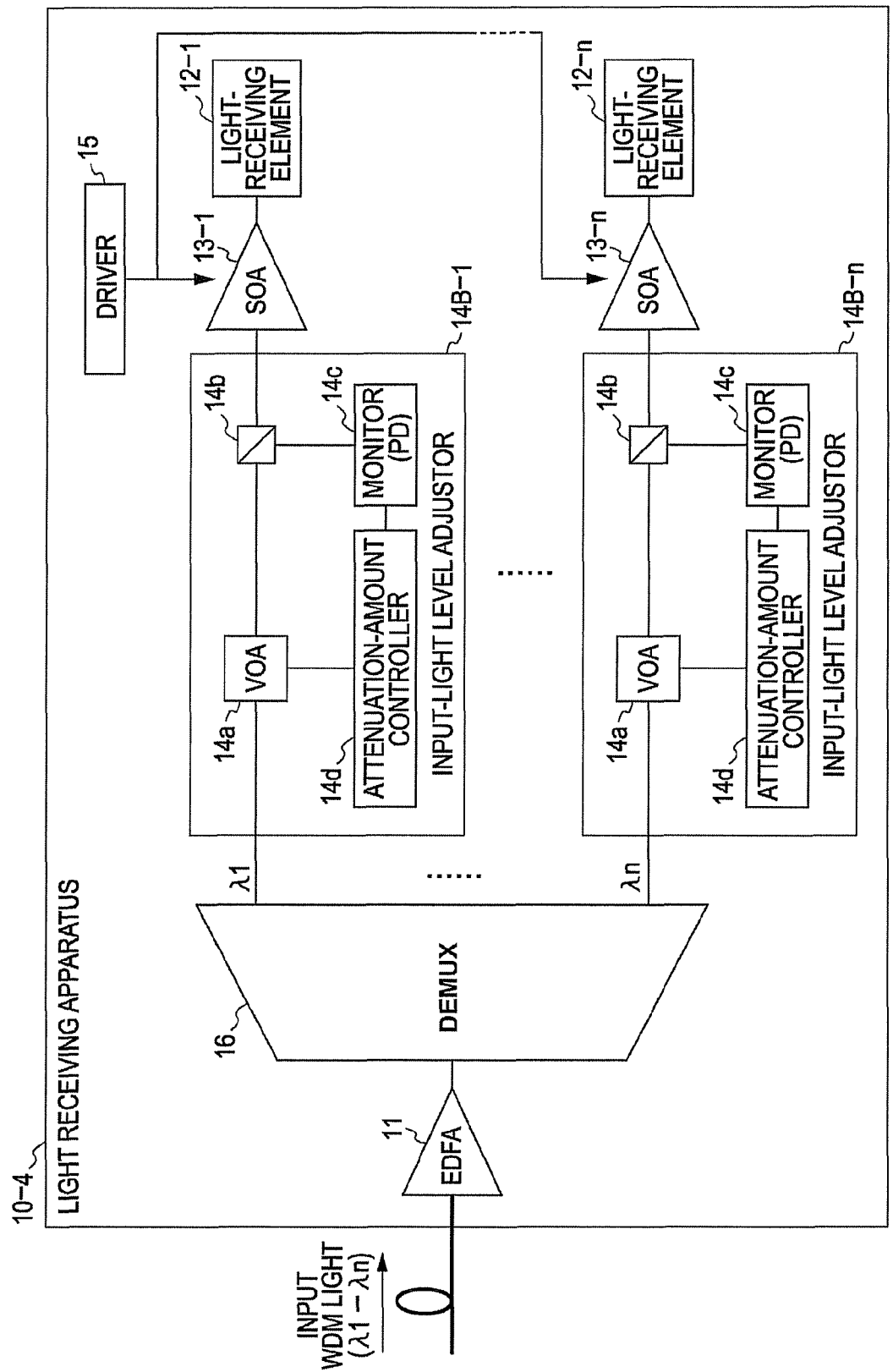
FIG. 9 is a diagram showing a configuration of a light receiving apparatus.

Next, the configuration for the case of receiving n waves of WDM light is explained as a configuration of the light receiving apparatus 10, with reference to FIG. 8 and FIG. 9. FIG. 8 is a diagram showing a configuration of the light receiving apparatus. A light receiving apparatus 10-3 is configured with an EDFA 11, light-receiving elements 12-1 to 12-n, SOAs 13-1 to 13-n, input-light level adjustors 14A-1 to 14A-n, a driver 15 and a demultiplexer 16. The input-light level adjustor 14A-1 to 14A-n is configured with a VOA 14a, a coupler 14b, a monitor 14c and an attenuation-amount control section 14d.

The EDFA 11 amplifies the input WDM light in which n waves are multiplexed in wavelength together, and outputs the amplified WDM light. The demultiplexer 16 separates the WDM light outputted from the EDFA 11 into n waves and sends them to the VOAs 14a in the input-light level adjustors 14A-1 to 14A-n on a wavelength-by-wavelength basis. As for the operation thereafter, identical control to that shown in FIG. 6 is performed for each wavelength and hence explanation is omitted.

FIG. 9 is a diagram showing a configuration of a light receiving apparatus. A light receiving apparatus 10-4 is configured with an EDFA 11, light-receiving elements 12-1 to 12-n, SOAs 13-1 to 13-n, input-light level adjustors 14B-1 to 14B-n, a driver 15 and a demultiplexer 16. The input-light level adjustor 14B-1 to 14B-n is configured with a VOA 14a, a coupler 14b, a monitor 14c and an attenuation-amount control section 14d.

The EDFA 11 amplifies the input WDM light in which n waves are multiplexed in wavelength together, and outputs the amplified WDM light. The demultiplexer 16 separates the WDM light outputted from the EDFA 11 into n waves and sends them to the VOAs 14a in the input-light level adjustors 14A-1 to 14A-n on a wavelength-by-wavelength basis. As for the operation thereafter, identical control to FIG. 7 is performed for each wavelength and hence explanation is omitted.

Figure 10:
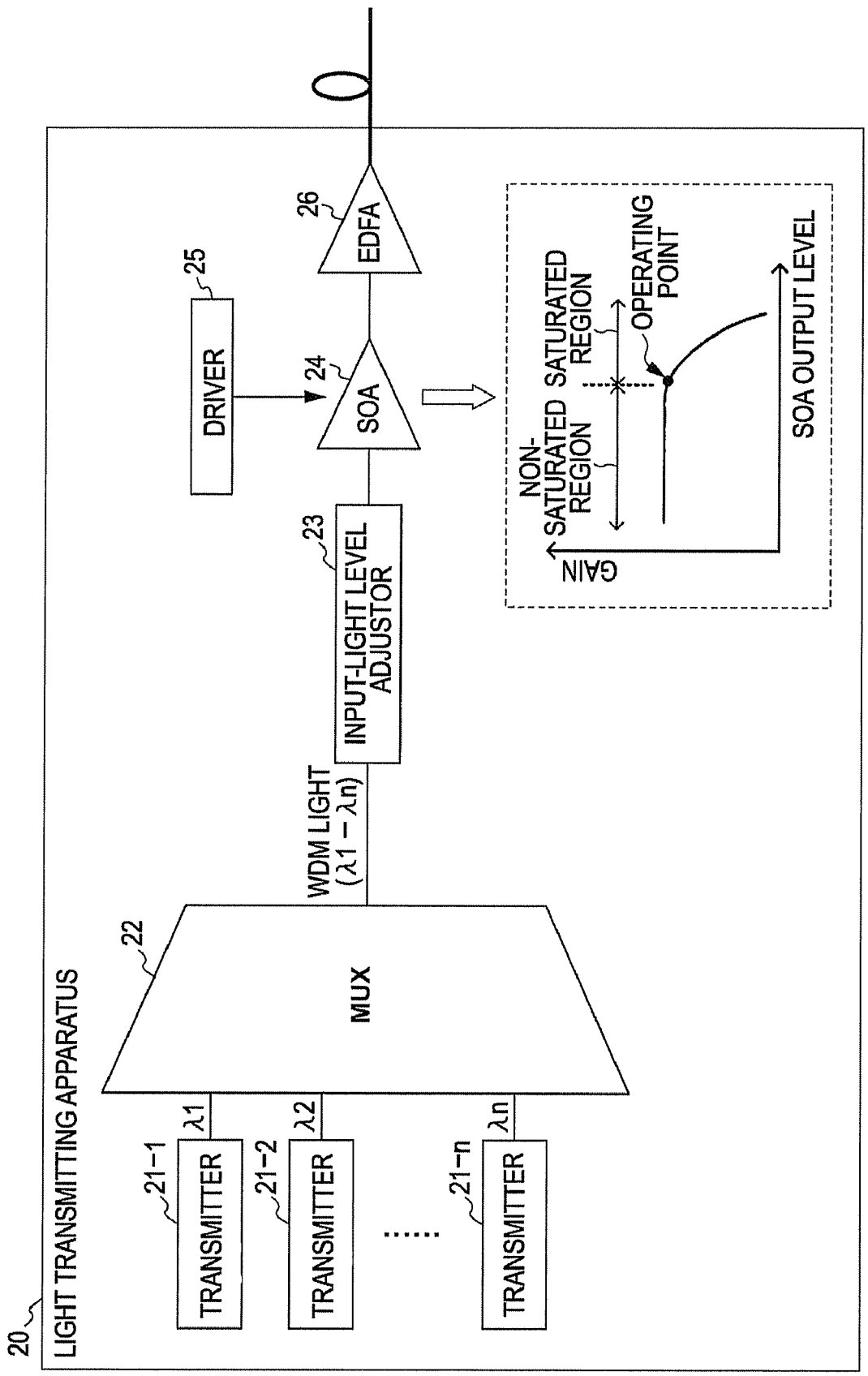
FIG. 10 is a diagram showing a configuration of a light transmitting apparatus.

Next, the case in which the optical surge suppression control performed in the light receiving apparatus 10 is applied to a light transmitting apparatus is explained. FIG. 10 is a diagram showing a configuration of a light transmitting apparatus. It shows a configuration of a light transmitting apparatus 20 that multiplexes n waves in wavelength together and generates and sends WDM light.

The light transmitting apparatus 20 is configured with transmitters 21-1 to 21-n, a wave synthesizing section 22, an input-light level adjustor 23, an SOA 24, a driver 25 and an EDFA 26. The transmitters 21-1 to 21-n respectively have E/O functions, to receive respective electrical signals and generate signal light having different wavelengths from one another. The wave synthesizing section 22 multiplexes together n waves having different wavelengths from one another and produces WDM light, and sends the WDM light to the input-light level adjustor 23.

The input-light level adjustor 23 controls the level of the WDM light outputted from the wave synthesizing section 22 and adjusts the level of light input to the SOA 24. The driver 25 supplies a drive current for adjusting the level of output light of the SOA 24, to the SOA 24. The SOA 24 amplifies the WDM light that has been adjusted in terms of level of input light while the EDFA 26 further amplifies the WDM light, outputted from the SOA 24, and outputs it through an optical fiber.

The input-light level adjustor 23 establishes the level of input light such that the operating point of the SOA 24 lies close to a boundary between a non-saturated region and a saturated region, with respect to an amplification characteristic of the SOA 24 in which amplification is performed on a supplied drive current. Incidentally, because the internal configuration of and level control performed by the input-light level adjustor 23 takes the form described in FIG. 6 or FIG. 7 and it performs level control as described in FIG. 6 or FIG. 7, the explanation is omitted.

Here, in the light transmitting apparatus 20, an operation is performed to remove the cause of optical surge occurrence by means of the EDFA 26. Namely, by arranging before the EDFA 26 the SOA 24 established with an operating point close to a boundary between a non-saturated region and a saturated region, fluctuations are suppressed in amount in advance by the SOA 24 even if an input change (increase/decrease of wavelengths being multiplexed) occurs, so that the occurrence of an optical surge can be prevented in advance at the EDFA 26.

Meanwhile, according to the configuration of the light transmitting apparatus 20, even where an instantaneous interruption of signal light or a drop in level of input light occurs due to a certain cause (this is also one of causes of optical surge occurrences), a constant level of ASE (Amplified Spontaneous Emission) is continuously outputted even in the absence of an input to the SOA 24 if a drive current is continuously applied to the SOA 24, so that it is possible to reduce the effect of level fluctuation of the light to be inputted to the EDFA 26 and to prevent optical surge occurrence in the EDFA 26.

Figure 11:
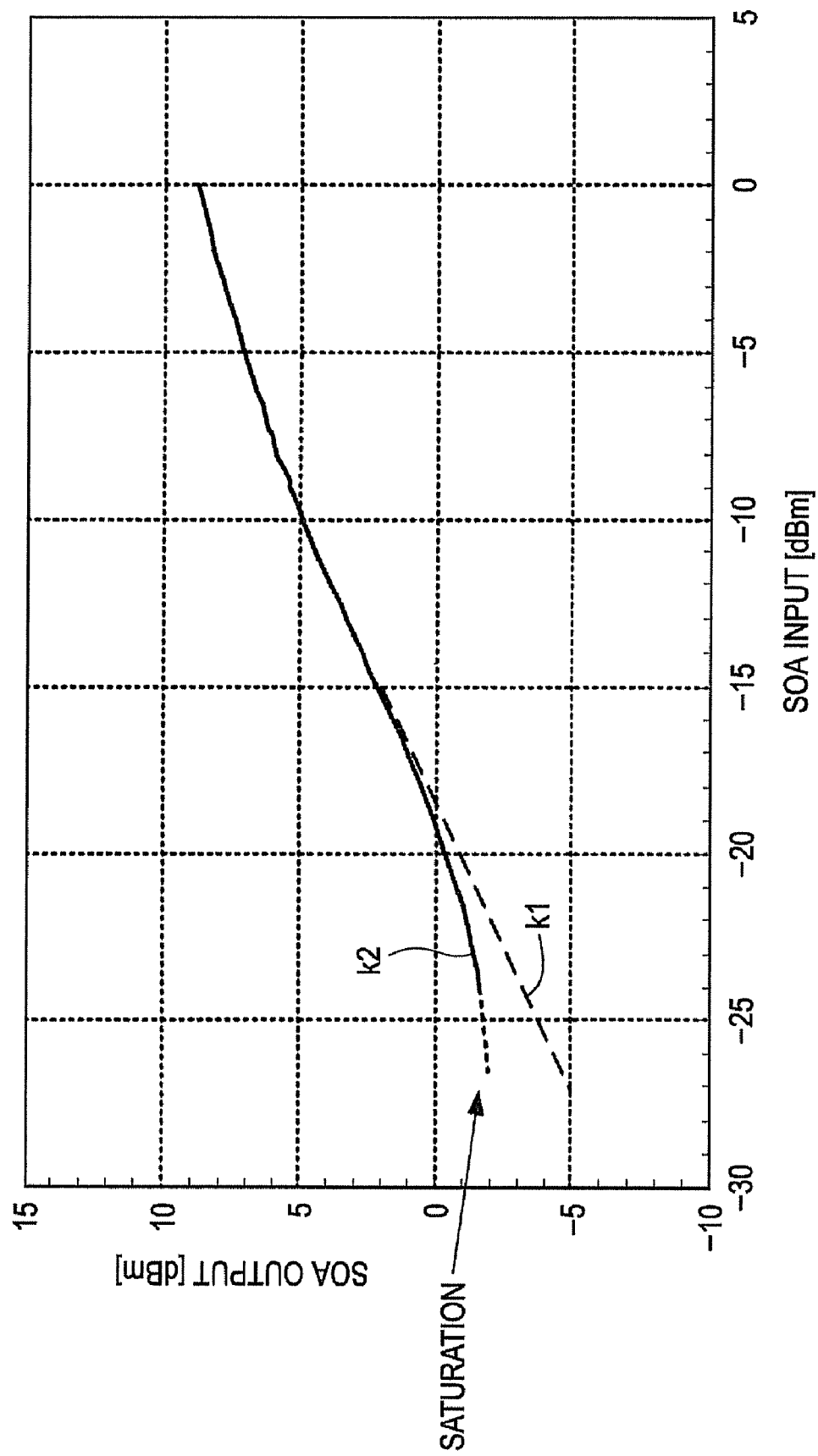
FIG. 11 is a figure showing the level of output light of the SOA.

FIG. 11 is a figure showing the level of output light of the SOA 24. The vertical axis denotes an output-light level dBm while the horizontal axis denotes an input-light level dBm, showing the relationship between an output-light level (including an ASE level) and an input-light level in the case where a certain gain is set in the SOA 24. It can be seen that, even if the level of light input to the SOA 24 becomes lower, the level of output light does not become lower as shown by the dotted line k1 but the level of output light saturates at a constant level as shown by the dotted line k2.

Accordingly, even where the level of light input to the SOA 24 becomes lower instantaneously, the level of output light of the SOA 24 is held at a level equal to or higher than a constant, making it possible to reduce the adverse effect upon the level of light input to the EDFA 26 located therebefore.

Incidentally, although the SOA 24 was structurally provided before the EDFA 26 in the above light transmitting apparatus, it may be arranged after the EDFA 26 if the saturation output of the SOA 24 is sufficiently great. In this case, the level amplified by the EDFA 26 is not restricted and suppression of a sharp, high-level optical surge caused in the EDFA 26 is possible.

Next, the operation and control of the light receiving apparatus 10 is explained in detail hereafter. First, setup control of the drive current to be injected into the SOA 13 is explained. In the light-receiving element 12 located after the SOA 13, because the light-receiving element 12 has a light-receiving level whose absolute maximum rating generally is approximately 0 to +5 dB for the case of an APD for example, if there is an incidence of optical power equal to or greater than that, device fracture results.

Consequently, in the case where the maximum light-receiving level in the light-receiving element 12 is taken as +5 dBm, the amount of current for driving the SOA 13 is adjusted to inject such a drive current that the saturation point (level of output light) of the SOA 13 does not exceed +5 dBm.

Figure 12:
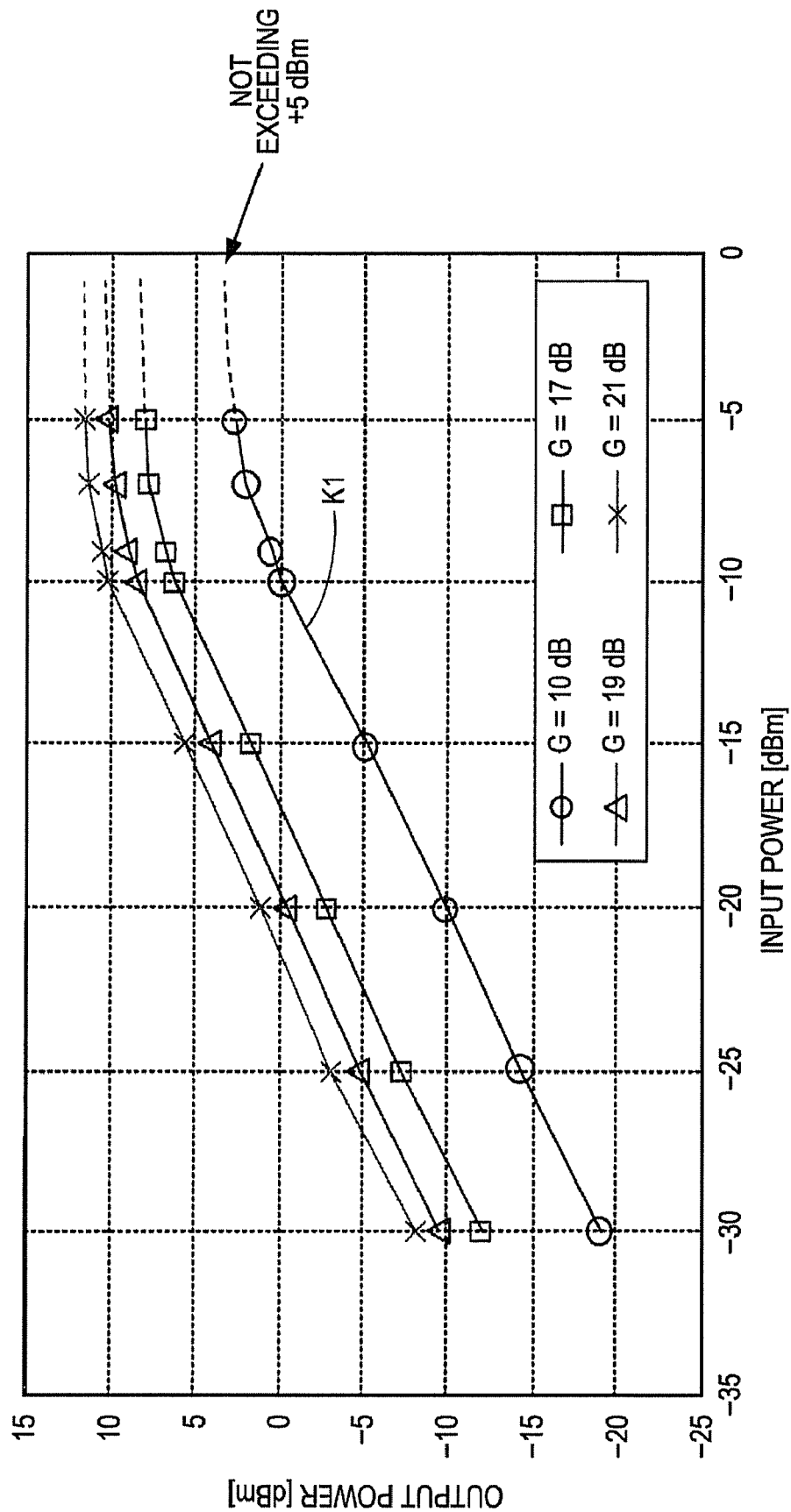
FIG. 12 is a figure showing the level of output light of the SOA.
Figure 13:
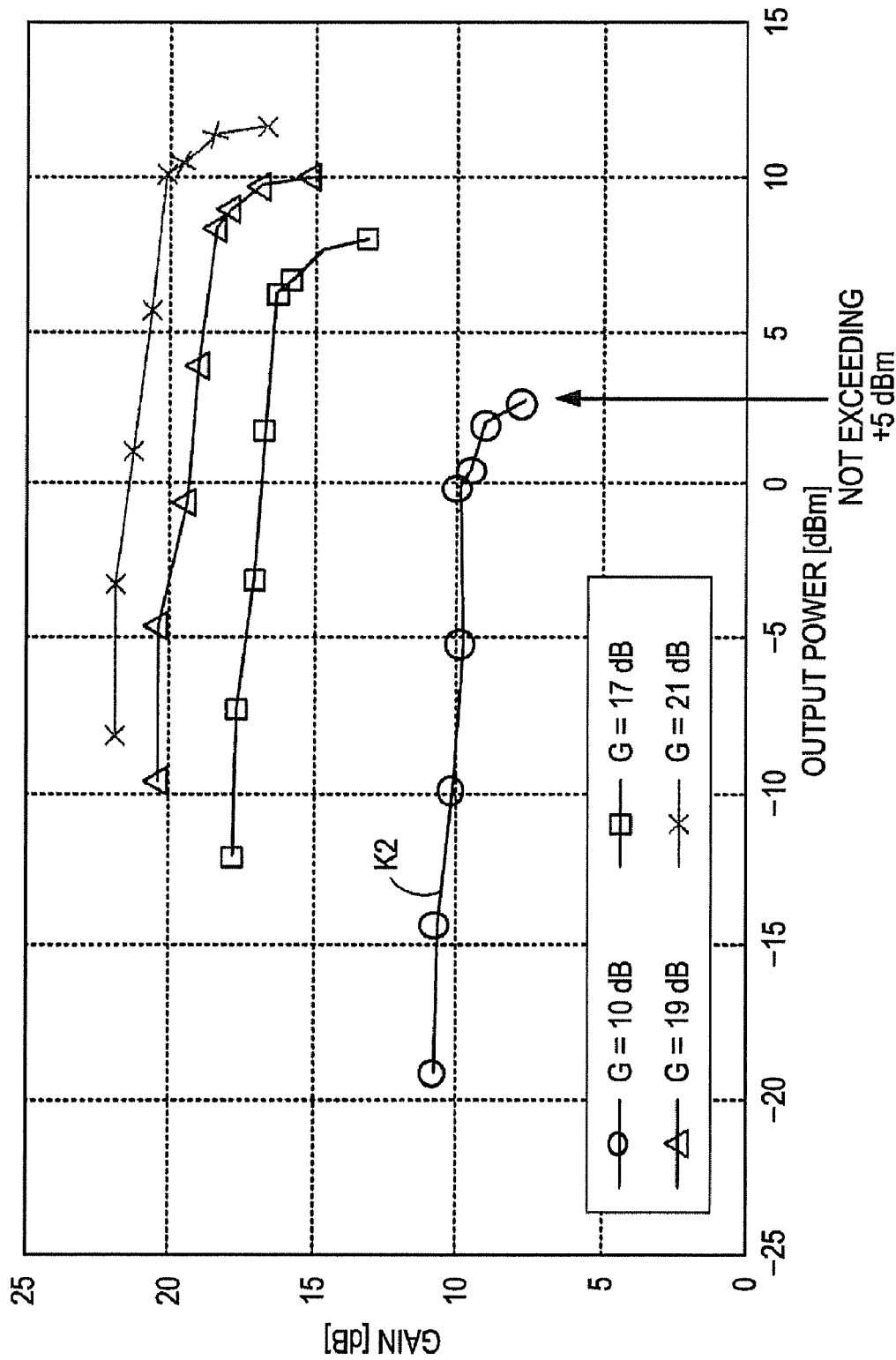
FIG. 13 is a figure showing the gain of the SOA.

FIG. 12 is a figure showing the level of output light of the SOA 13. The vertical axis denotes an output-light level dBm while the horizontal axis denotes an input-light level dBm, and an output-light level against an input-light level is shown. Meanwhile, FIG. 13 is a figure showing the gain of the SOA 13. The vertical axis denotes a gain dB while the horizontal axis denotes an input-light level dBm, and the relationship between a gain and an output-light level is shown.

As can be seen from the graph K1 for a gain of 10 dB shown in FIG. 12 and the graph K2 for a gain of 10 dB shown in FIG. 13, it can be seen that the level of output light is +5 dBm or smaller for the case of a gain of 10 dB of the SOA 13 regardless of the level of input light (in the other graphs of gains shown in FIG. 12 and FIG. 13, +5 dBm is exceeded where the level of input light is increased).

Accordingly, if the amount of current for driving the SOA 13 is adjusted such that the gain of the SOA 13 becomes 10 dB, the light-receiving element 12 can be protected because the level of output light of the SOA 13 can be suppressed to +5 dBm or smaller.

Figure 14:
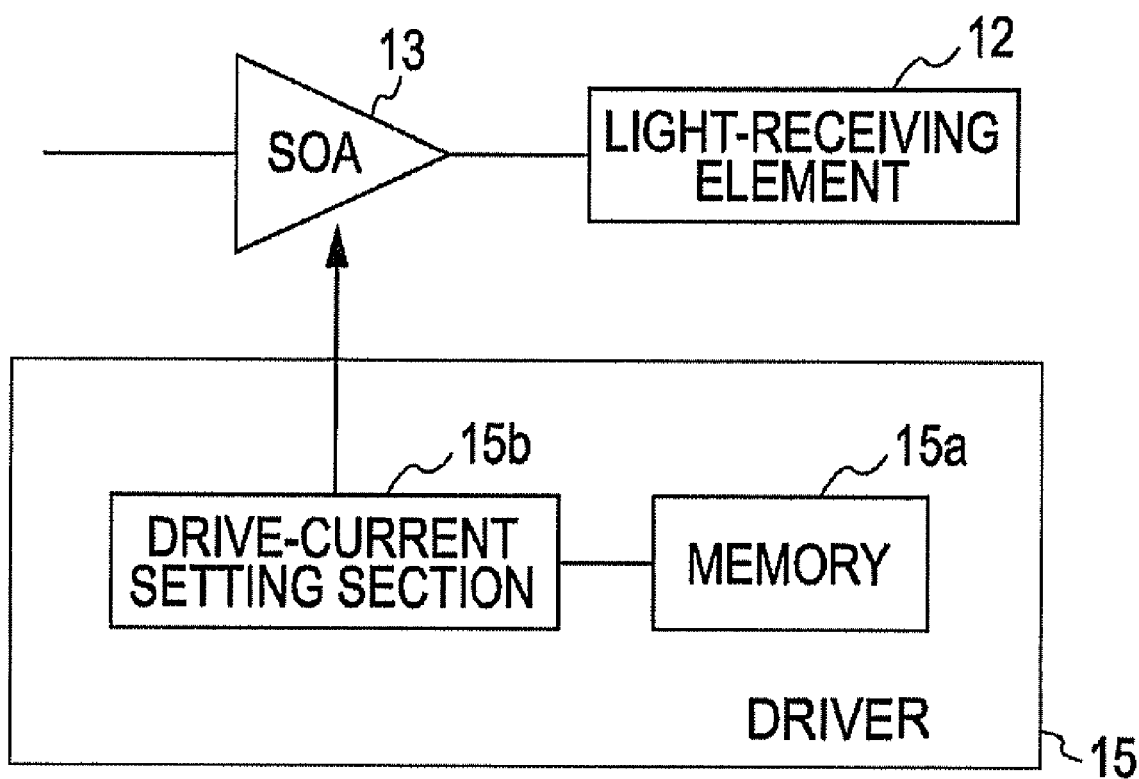
FIG. 14 is a diagram showing a configuration of a driver.

FIG. 14 is a diagram showing a configuration of the driver 15. The driver 15 is configured with a memory 15a and a drive-current setting section 15b. The memory 15a stores a correspondence relationship between an absolute maximum rating of light-receiving level according to the type of the light-receiving element 12 and a drive current value with respect to outputting, from the SOA 13, signal light of a level not exceeding the absolute maximum rating. The drive-current setting section 15b, at a startup of the apparatus, reads from the memory 15a the value of drive current corresponding to the light-receiving element 12 installed in the apparatus and applies the drive current to the SOA 13.

Figure 15:
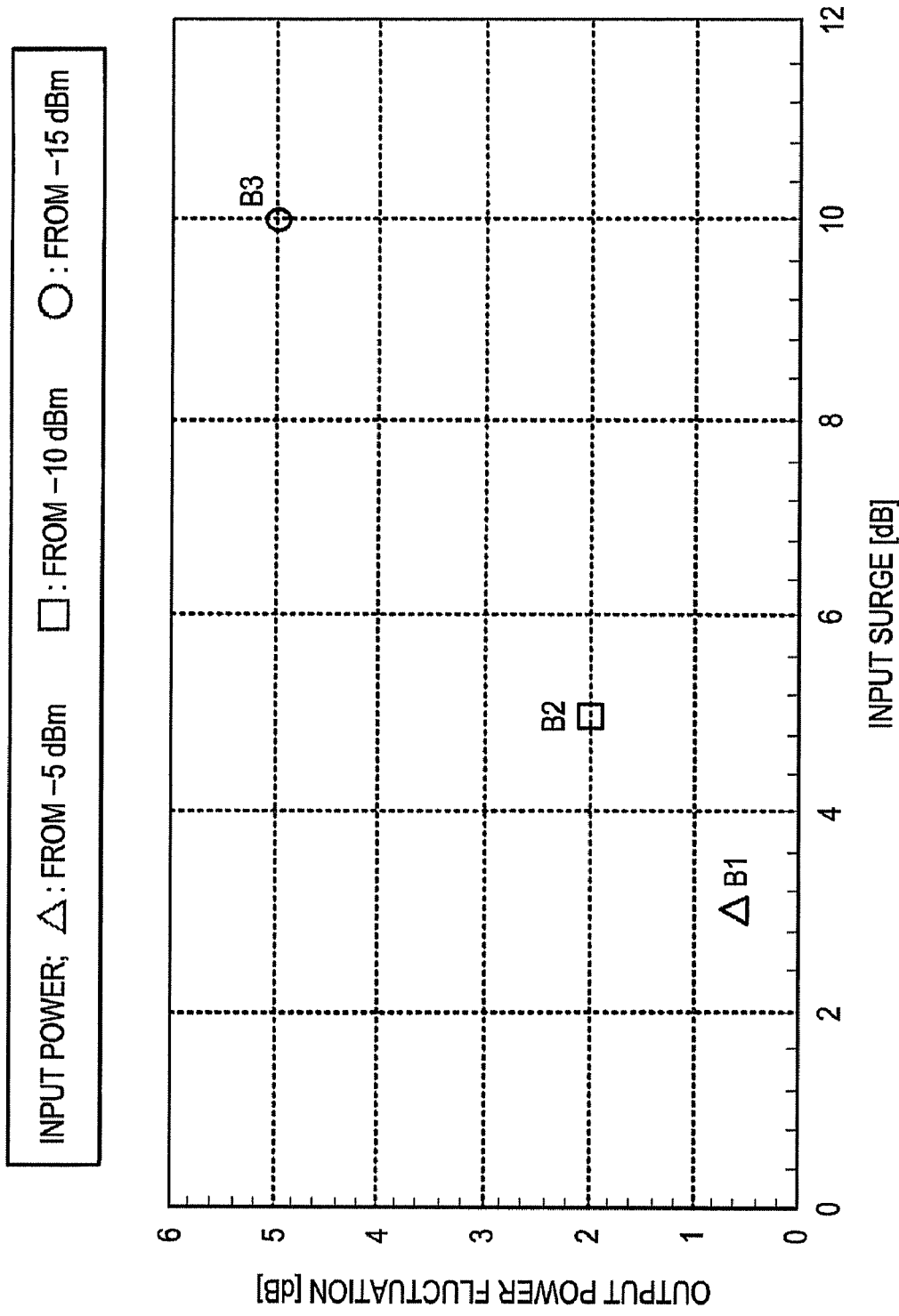
FIG. 15 is a figure showing the amount of output-light level fluctuation in the SOA 13.

Next, a simulation result showing the suppression of optical surges by means of the SOA 13 is explained. FIG. 15 is a figure showing the amount of output-light level fluctuation at the SOA 13. The vertical axis denotes the amount of output-light level fluctuation dB while the horizontal axis denotes the amount of input-light change in level dB, showing to what degree the level of output light fluctuates against the amount of input-light change in level. The differences between the marks of plots (triangles, rectangles and circles) shown in the figure indicate the level values of the light that has already been inputted to the SOA 13 upon abruptly changing the level of input light.

At a triangle mark point B1 in the figure, it is shown that the amount of output-light level fluctuation at the SOA 13 is suppressed at 0.5 dB in the case that an input-light change in level of an amount of 3 dB is given when signal light having an input-light level of −5 dBm is provided to the SOA 13.

At a rectangle mark point B2 in the figure, it is shown that the amount of output-light level fluctuation at the SOA 13 is suppressed at 2 dB in the case that an input-light change in level of an amount of 5 dB is given when signal light having an input-light level of −10 dBm is provided to the SOA 13.

At a circle mark point B3 in the figure, it is shown that the amount of output-light level fluctuation at the SOA 13 is suppressed at 5 dB in the case that an input-light change in level of an amount of 10 dB is given when signal light having an input-light level of −15 dBm is provided to the SOA 13.

Figure 16:
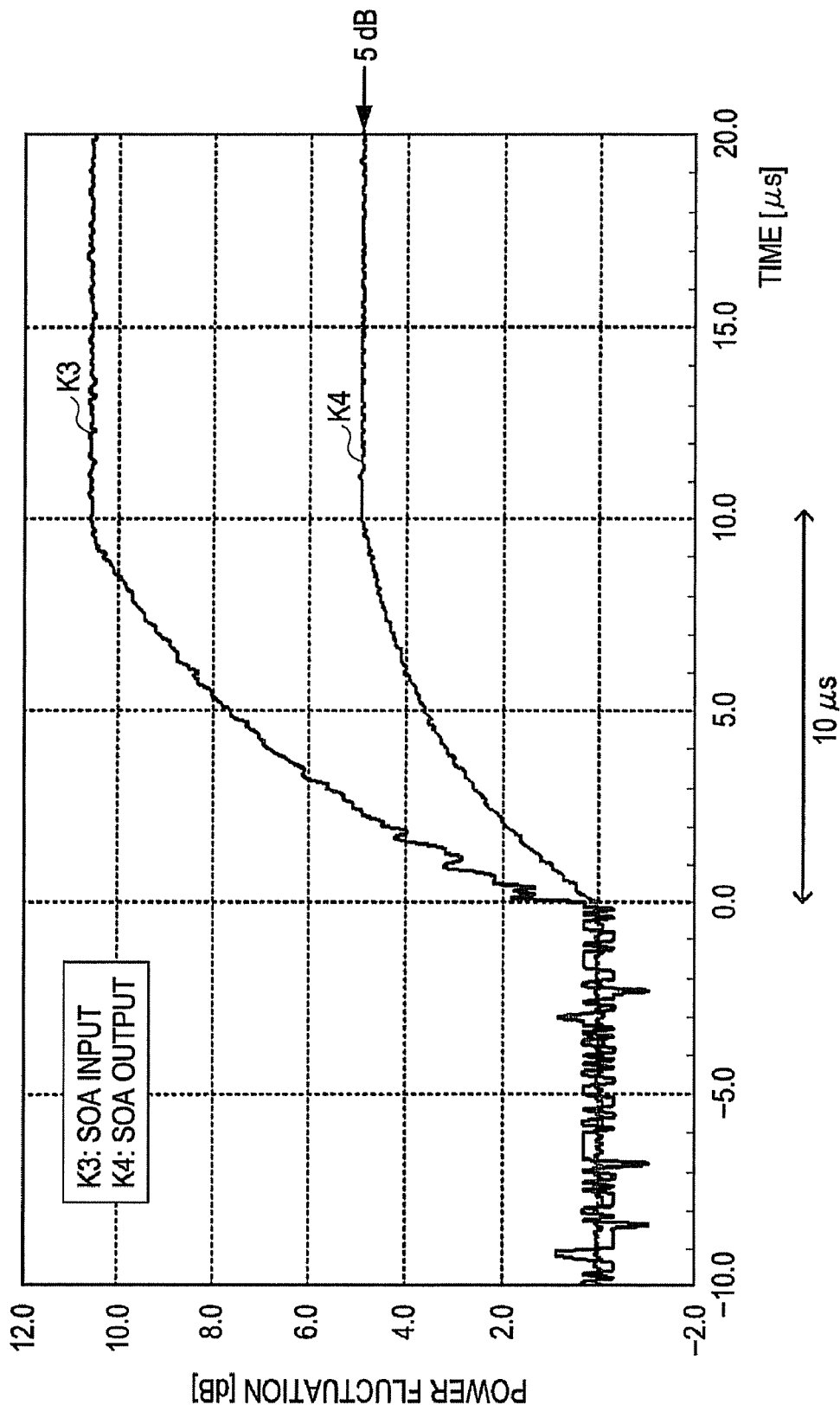
FIG. 16 is a figure showing the waveform of change in level amount of input light and the waveform of level fluctuation amount of output light in the SOA 13.

FIG. 16 is a figure showing the waveform of change in level amount of input light and the waveform of level fluctuation amount of output light in the SOA 13. The vertical axis denotes the amount of output-light level fluctuation dB while the horizontal axis denotes time μs. It shows a waveform of level fluctuation at the point B3 in FIG. 15, where a waveform K3 is a waveform of change in level amount of input light while a waveform K4 is a waveform of fluctuation amount of output light.

In the case in which an input-light level change amount of 10 dB is given, the SOA 13 has an output-light level fluctuation amount of 5 dB, and the time at which the input-light level change is given is 10 μm. Although the assumed time of abrupt light change in level due to an optical surge is approximately 1 ms, a result is obtained that the amount of abrupt light change in level is suppressed even for a change time of 10 μs, sufficiently faster than 1 ms, showing that optical surge suppression by the SOA 13 is effective.

Figure 17:
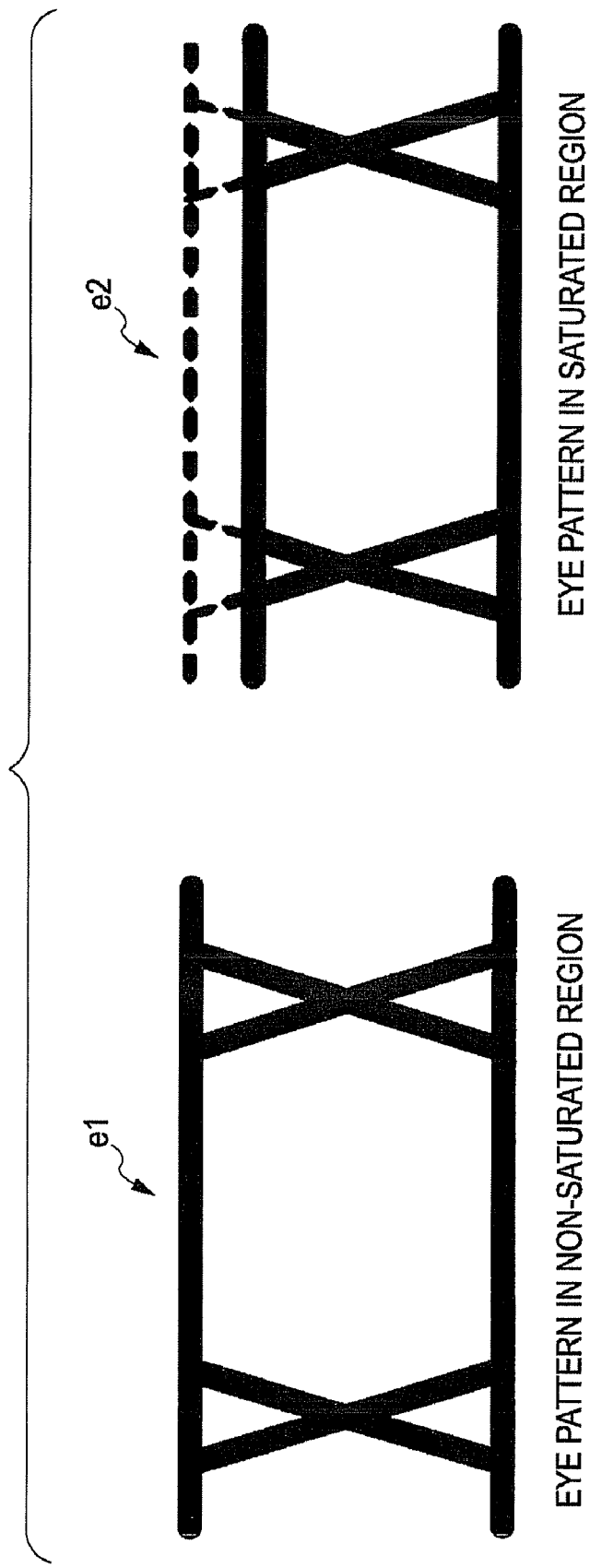
FIG. 17 is a figure showing eye patterns in the non-saturated region and saturated region for the SOA.

Next, points to be considered upon establishing an operating point of the SOA 13 are explained. FIG. 17 is a figure showing eye patterns for the non-saturated region and the saturated region in the SOA 13. Between the non-saturated region and the saturated region in the SOA 13, eye patterns of signal light are different, the eye pattern e2 in the saturated region being flatter in its eye than the eye pattern e1 in the non-saturated region. As the gain becomes lower, the degree of flattening of the eye pattern e2 worsens and the quality of transmission is significantly deteriorated.

For this reason, when setting up an operating point close to a boundary between a non-saturated region and a saturated region, to set up operating point takes care about not to provide an operating point excessively low (not to provide an excessively low gain) at its established point in the graph in FIG. 4.

Figure 18:
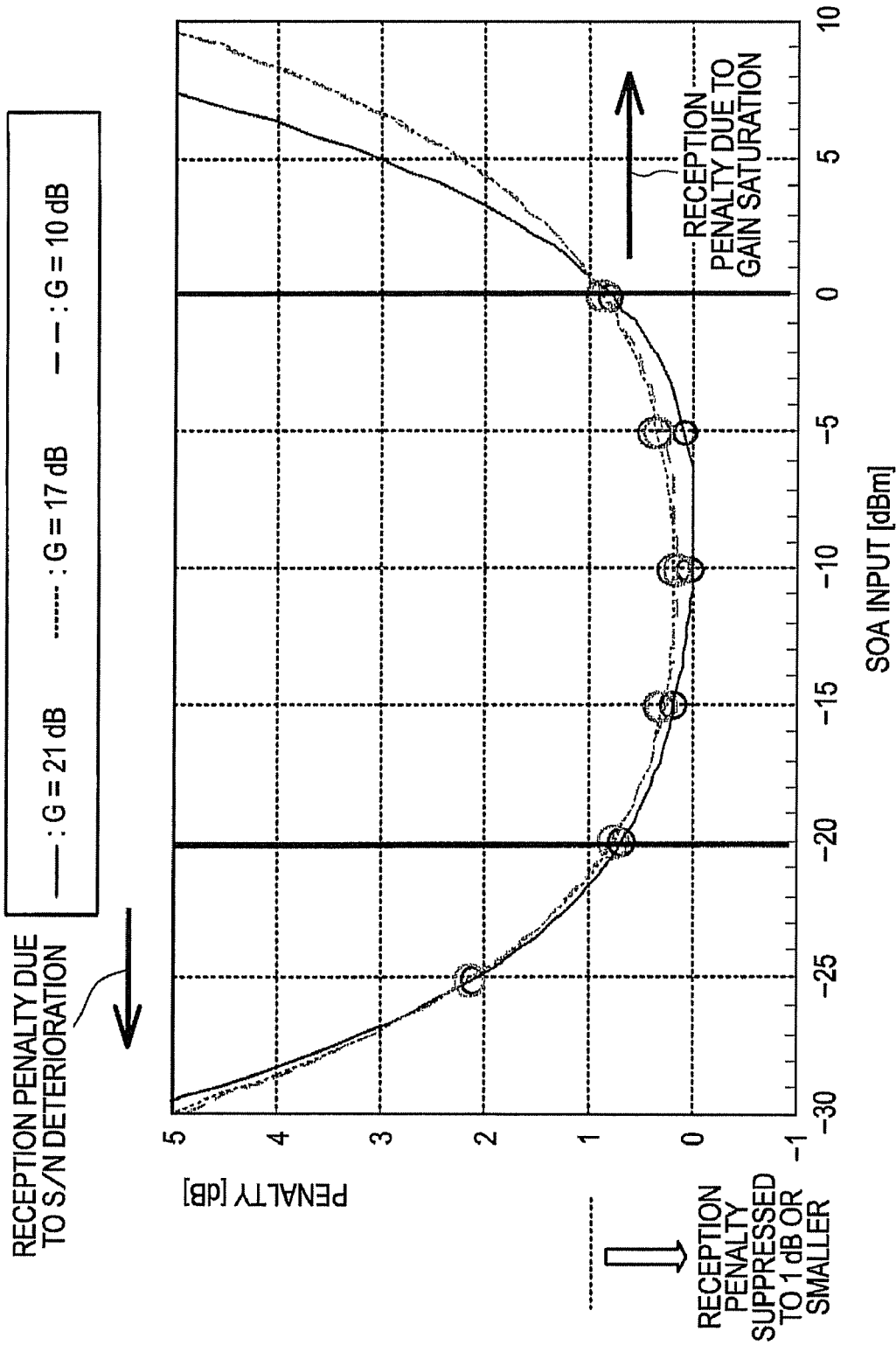
FIG. 18 is a figure showing a reception penalty.

FIG. 18 is a figure showing a reception penalty. The vertical axis denotes a reception penalty dB while the horizontal axis denotes an input-light level dBm to the SOA 13, and shows reception penalty curves for the respective gains of the SOA 13.

If the level of light input to the SOA 13 is excessively low, reception penalty naturally increases because of S/N deterioration. Even if the level of input light increases gradually, the eye pattern becomes flattened because a gain saturated region is entered, so that the reception penalty increases. Accordingly, when setting up an operating point, up to what dB the reception penalty can be allowed for an allowable amount of surge to be inputted to the SOA 13 in the actual situation of use is considered.

Here, assuming that reception penalty is suppressed to 1 dB or smaller, it can be understood that the upper limit value of input-light level is satisfactorily suppressed at 0 dB or smaller for all the three gains (G=21 dB, 17 dB and 10 dB). Because 0 dBm is an input-surge included value, the upper-limit value of input-light level for the SOA 13 is determined after determining to what degree the allowable amount of surge is to be set up.

Assuming that reception penalty is desirably suppressed to 1 dB or smaller even if an optical surge of 5 dB is inputted, it can be determined from FIG. 18 that the level of light input to the SOA 13 is satisfactorily set up at −5 dBm or smaller (−5 dBm+5 dB=0 dBm, so that reception penalty is 1 dB or smaller even if an optical surge of 5 dB is inputted).

Figure 19:
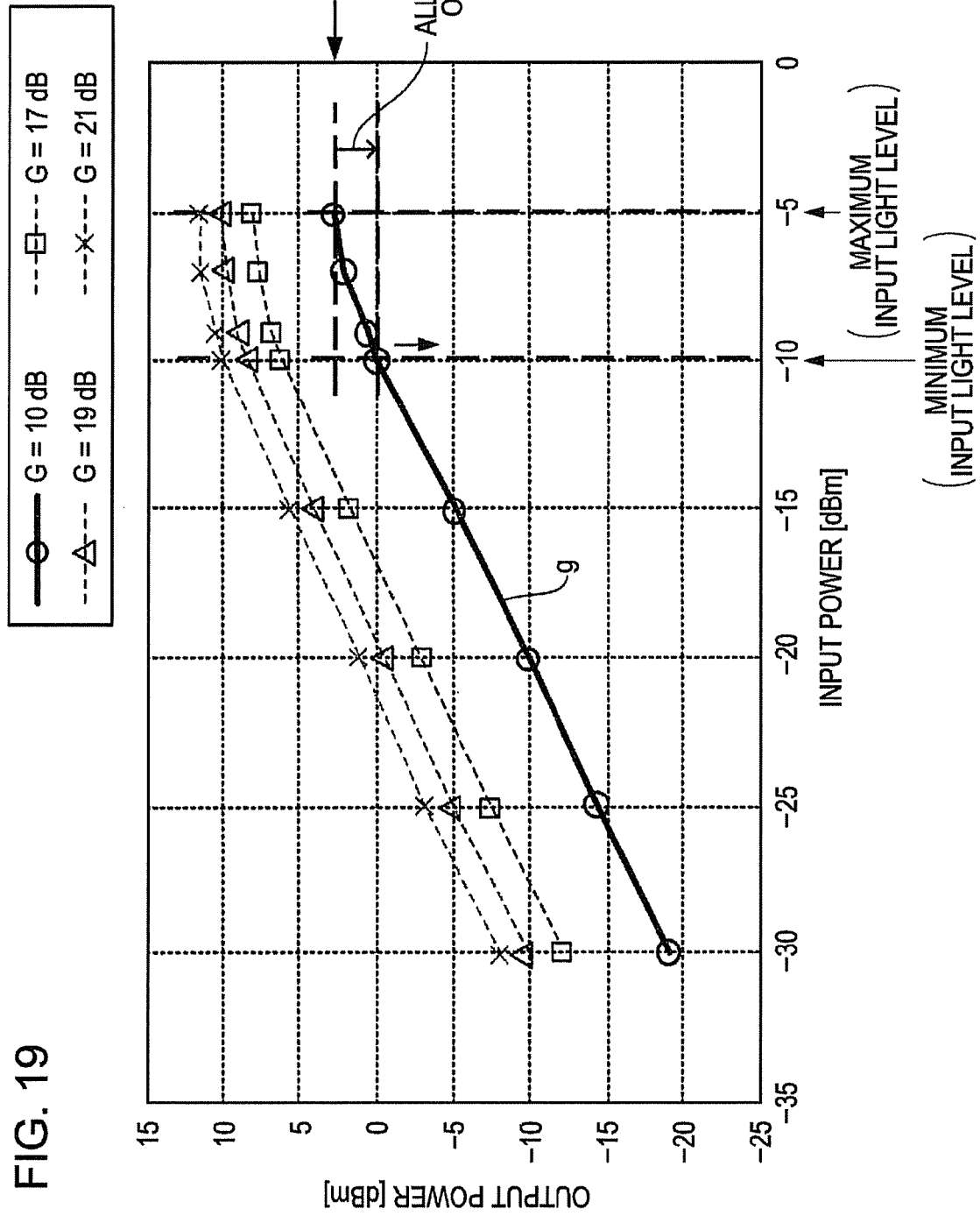
FIG. 19 is a figure showing the level of output light of the SOA.
Figure 20:
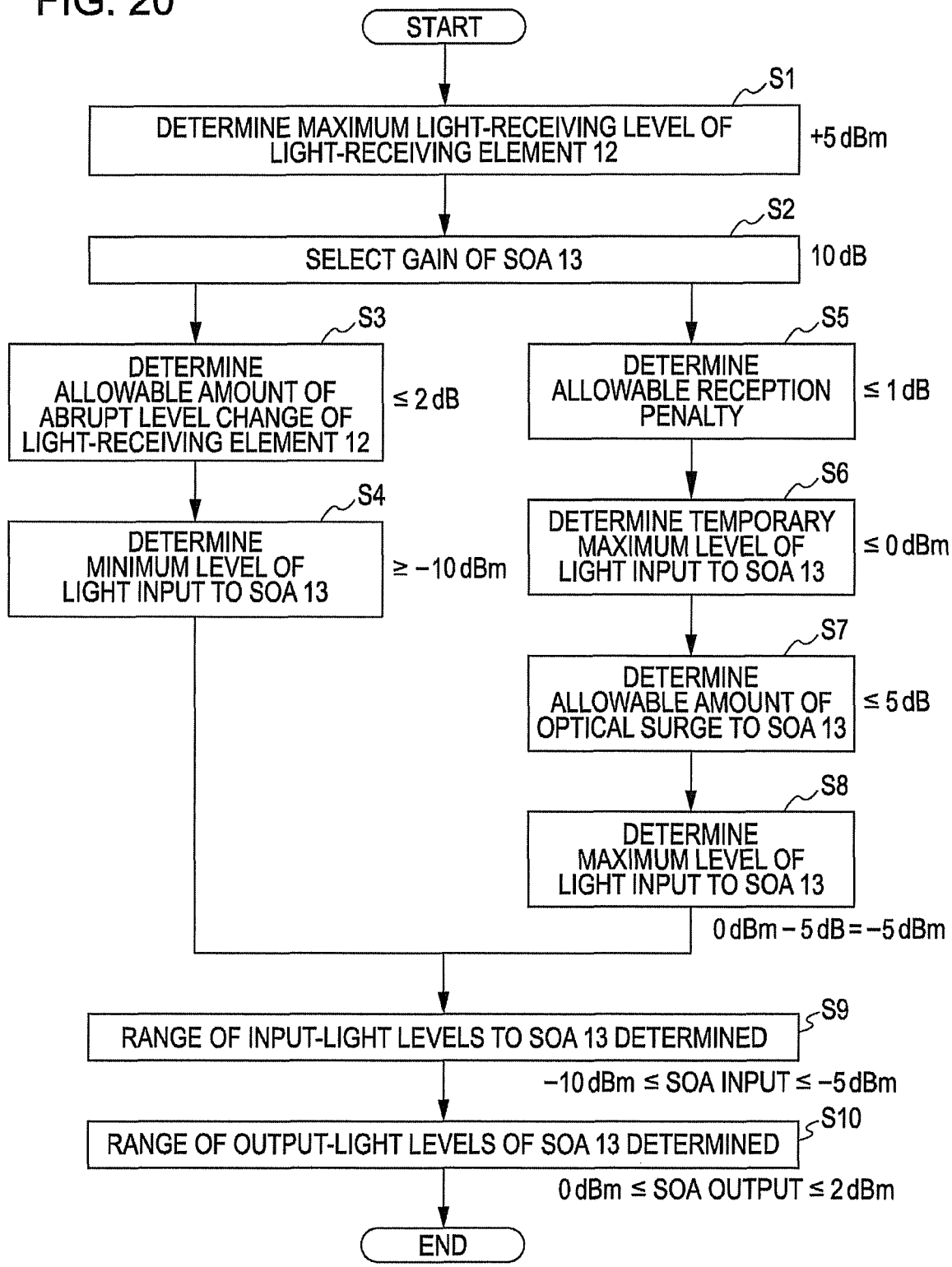
FIG. 20 is a flowchart showing a procedure for setting up an operating point of the SOA.
Figure 21:
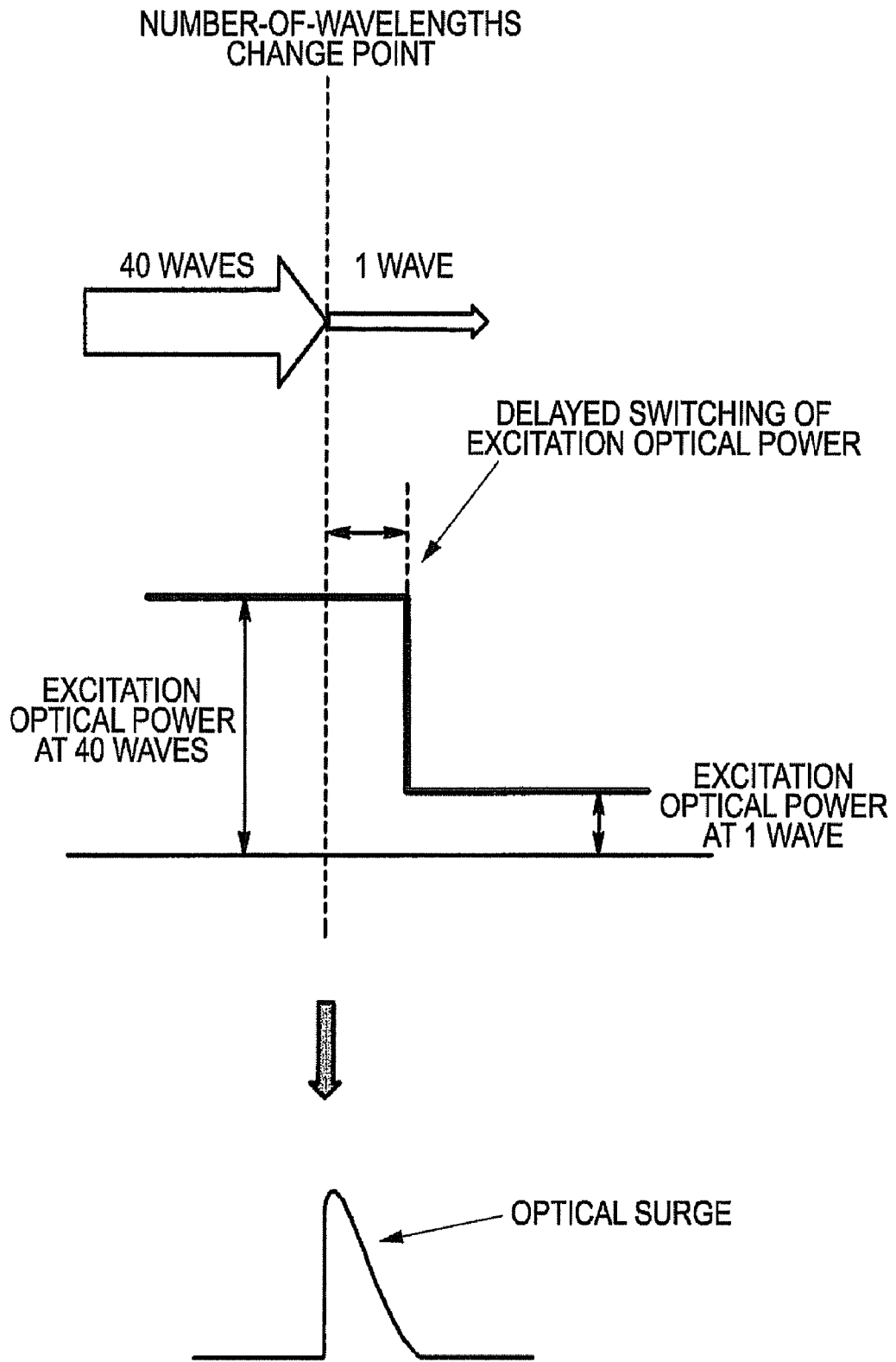
FIG. 21 is a figure showing an optical surge.

Next, the procedure of setting up an operating point of the SOA 13 (i.e. input-light level setup procedure for the SOA 13) is explained while showing concrete numerical examples by use of FIG. 18, FIG. 19 and FIG. 20.

FIG. 19 is a figure showing an output-light level of the SOA 13. The vertical axis denotes an output-light level dBm while the horizontal axis denotes an input-light level dBm, and shows an output-light level against an input-light level. Meanwhile, FIG. 20 is a flowchart showing a procedure of setting up an operating point of the SOA 13.

[S1] A maximum light-receiving level of the light-receiving element 12 is determined. In the case of an APD for example, the maximum light-receiving level of the light-receiving element 12 here is determined to be +5 dBm, because it falls within the range of the absolute maximum rating if the maximum light receiving level is taken as +5 dBm as mentioned above.

[S2] A gain of the SOA 13 is selected. Because it is known from FIG. 19 that the gain at which the level of output light of the SOA 13 is not in excess of +5 dBm is fallen under the case of 10 dB, the gain of the SOA 13 is determined to be 10 dB (the graph for a gain 10 dB in FIG. 19 is taken as a functional curve g).

[S3] An allowable amount of abrupt change in level that is the amount of abrupt change in level of input light that the light-receiving element 12 can allow is determined. Here, it is set up as 2 dB or smaller.

[S4] A minimum level of light input to the SOA 13 is determined. In FIG. 19, the gain saturation point at a gain of 10 dB on the functional curve g is 2 dBm. Accordingly, the point on the functional curve g where the level of input light is lowered by 2 dB (value of the allowable sudden-change in-level amount determined at the step S3) from the gain saturation point is a value of −10 dBm. This value −10 dBm is given as the minimum level of light input to the SOA 13.

[S5] An allowable reception penalty is determined. From the characteristic of a reception penalty curve shown in FIG. 18, allowable reception penalty here is assumably suppressed at 1 dB or smaller.

[S6] A maximum level of light input to the SOA 13 not exceeding the allowable reception penalty is determined. If the maximum level of light input to the SOA 13 that is not in excess of the allowable reception penalty is referred to as a temporary maximum level of input light, it can be seen from FIG. 18 that, in order to suppress the allowable reception penalty to 1 dB or smaller, the temporary maximum level of light input to the SOA 13 is satisfactorily provided at 0 dBm.

[S7] An allowable optical surge amount that is an allowable amount of optical surge to be inputted to the SOA 13 is determined. Here, it is set up as 5 dB or smaller.

[S8] A maximum level of light input to the SOA 13 is determined. Here, because the reception penalty is suppressed to 1 dB or smaller even if an optical surge of 5 dB is inputted, the level of light input to the SOA 13 may be set up as −5 dBm or smaller, by subtracting the allowable optical surge amount (5 dB) from the temporary maximum level of input light (0 dBm) determined in step S6. Consequently, the maximum level of light input to the SOA 13 is determined as −5 dBm.

[S9] The range of input-light levels to the SOA 13 is determined (the operating point of the SOA 13 is determined). Based on the steps S4 and S8, the range of input-light levels to the SOA 13 is given as −10 dBm≦SOAinput≦−5 dBm, where the level of light input to the SOA 13 is denoted as SOAinput.

[S10] The range of output-light levels of the SOA 13 is determined. Incidentally, when the level of output light of the SOA 13 is denoted as SOAoutput, the range of output-light levels of the SOA 13 is given as 0 dBm≦SOAoutput≦2 dBm because SOAoutput=0 dBm when SOAinput=−10 dBm and SOAoutput=2 dBm when SOAinput=−5 dBm on the functional curve g in FIG. 19.

As explained so far, in the conventional optical surge suppression, although an operation was performed in such a manner that an optical surge was suppressed to the greatest possible extent under circuit control after detecting a change in level, great effects could not obtained because control cannot follow an instantaneous change. In contrast to this, the light receiving apparatus 10 is capable of positively preventing damage to the light-receiving element or the occurrence of signal errors because of its configuration for suppressing an optical surge by the utilization of physical phenomenon of the SOA.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An optical amplifier apparatus comprising:
    an optical amplifier including an amplification medium to amplify an optical signal and to output a first optical signal, the amplification medium being doped with an active substance for exciting itself;
    a semiconductor optical amplifier, arranged after the optical amplifier, to amplify the first optical signal and to output a second optical signal;
    a photo diode to receive the second optical signal;
    a driver including a memory medium to store data for a correspondence relationship between an absolute maximum rating of a light-receiving level according to a type of the photo diode and a drive current value, such that a maximum level of the second optical signal is within the absolute maximum rating, the driver being configured to supply a drive current to drive the semiconductor optical amplifier in order that the semiconductor optical amplifier has an amplification characteristic with respect to an input optical signal, the amplification characteristic including a gain non-saturated region and a gain saturated region, an amount of the drive current corresponding to being within the absolute maximum rating of the light-receiving level for the type of the photo diode based on the data stored in the memory medium; and
    an input-light level adjuster to adjust the first optical signal to an input optical signal light level of the semiconductor optical amplifier, the input optical signal light level being set up in the gain non-saturated region close to a boundary between the gain non-saturated region and the gain saturated region, so that when an optical surge is added into the input optical signal, an output optical signal level of the semiconductor optical amplifier has a designated region in which an optical signal to which the surge is added, is output.

2. The optical amplifier apparatus of claim 1, wherein the input-light level adjuster includes:
    a variable optical attenuator to attenuate the first optical signal and to output a third optical signal;
    a monitor to monitor the third optical signal and to output a monitor result; and
    an attenuating amount controller configured to control attenuating amount of the variable optical attenuator, based on the monitor result.

3. The optical amplifier apparatus of claim 1, wherein the input-light level adjuster includes:
    a variable optical attenuator to attenuate the first optical signal and to output a third optical signal,
    a monitor to monitor the third optical signal and to output a monitor result, and
    an attenuating amount controller configured to control an attenuating amount of the variable optical attenuator, based on the monitor result.

4. The optical amplifier apparatus of claim 1 further comprising:
    a demultiplexer to demultiplex the first optical signal; and
    a plurality of semiconductor optical amplifiers which amplify a plurality of optical signals, respectively demultiplexed by the demultiplexer.

* * * * *